United States Patent
Phillips

(10) Patent No.: US 10,789,746 B2
(45) Date of Patent: Sep. 29, 2020

(54) SYSTEMS AND METHODS FOR CREATING CUSTOM LASH DESIGN

(71) Applicant: THE LASH LOUNGE FRANCHISE, LLC, Colleyville, TX (US)

(72) Inventor: Anna Phillips, Colleyville, TX (US)

(73) Assignee: THE LASH LOUNGE FRANCHISE, LLC, Colleyville, TX (US)

( * ) Notice: Subject to any disclaimer, the term of this patent is extended or adjusted under 35 U.S.C. 154(b) by 0 days.

(21) Appl. No.: 15/999,398

(22) Filed: Aug. 20, 2018

(65) Prior Publication Data
US 2020/0058144 A1    Feb. 20, 2020

(51) Int. Cl.
| | |
|---|---|
| G06T 11/60 | (2006.01) |
| G06F 30/00 | (2020.01) |
| A41G 5/02 | (2006.01) |
| G06K 9/00 | (2006.01) |
| G06F 3/0482 | (2013.01) |
| H04N 5/232 | (2006.01) |
| G06F 3/0484 | (2013.01) |
| G06T 7/73 | (2017.01) |
| H04N 5/44 | (2011.01) |

(52) U.S. Cl.
CPC ............ *G06T 11/60* (2013.01); *A41G 5/02* (2013.01); *G06F 3/0482* (2013.01); *G06F 3/04845* (2013.01); *G06F 30/00* (2020.01); *G06K 9/0061* (2013.01); *G06K 9/00604* (2013.01); *G06T 7/73* (2017.01); *H04N 5/23229* (2013.01); *G06T 2200/24* (2013.01); *G06T 2207/30201* (2013.01); *H04N 5/4403* (2013.01)

(58) Field of Classification Search
CPC ............ G06K 9/0061; G06K 9/00604; G06K 9/00597; G06K 9/00268; G06K 9/00281; G06K 9/00248; G06K 9/00315; A46B 9/021; H04L 2025/03592; H04N 19/162; H04N 19/132; A61F 9/00808; A61F 9/008; A61F 2009/00846; A61F 2009/00844; G06T 2219/2012; G06T 2207/30201; G06T 2207/30041; G06T 2207/20076; Y10T 403/32959; Y10T 24/44769; Y10T 137/788; Y10S 514/914; H02G 3/30; A61B 2503/22
See application file for complete search history.

(56) References Cited

U.S. PATENT DOCUMENTS

| | | | | |
|---|---|---|---|---|
| 3,517,673 | A * | 6/1970 | Kim | A41G 5/02 |
| | | | | 132/214 |
| 3,557,653 | A * | 1/1971 | Kim | A41G 5/02 |
| | | | | 132/56 |
| 8,225,800 | B2 | 7/2012 | Byrne | |
| 9,004,076 | B2 | 4/2015 | Le | |
| 9,456,646 | B2 | 10/2016 | Caline | |
| 2006/0147119 | A1* | 7/2006 | Takano | A61B 3/0025 |
| | | | | 382/203 |

(Continued)

*Primary Examiner* — Hung Q Dang
(74) *Attorney, Agent, or Firm* — Haynes and Boone, LLP

(57) ABSTRACT

A method and system implemented on a mobile device for improving lash application. An image of an eye is received, An eye profile and a point of emphasis are identified for the eye using the image. A lash framework is generated based on the eye profile and the point of emphasis. A custom lash design is created using the lash framework. The custom lash design is used for physical application of a set of lashes to the eye.

28 Claims, 24 Drawing Sheets

(56) References Cited

U.S. PATENT DOCUMENTS

| | | | |
|---|---|---|---|
| 2007/0023062 A1 | 2/2007 | McKinstry | |
| 2007/0272264 A1* | 11/2007 | Byrne | A41G 5/02 132/201 |
| 2008/0245383 A1* | 10/2008 | Tomandl | A45D 33/008 132/200 |
| 2013/0089584 A1* | 4/2013 | Jager Lezer | A45D 44/22 424/401 |
| 2013/0312782 A1* | 11/2013 | Kindall | A41G 5/02 132/201 |
| 2015/0114421 A1* | 4/2015 | Pham | A41G 5/02 132/201 |
| 2016/0058158 A1* | 3/2016 | Tomita | H04N 5/23222 348/78 |
| 2016/0324241 A2* | 11/2016 | Lee | A41G 5/02 |
| 2017/0076474 A1* | 3/2017 | Fu | G06T 11/00 |
| 2017/0255478 A1* | 9/2017 | Chou | G06F 3/011 |
| 2018/0343948 A1* | 12/2018 | Miller | B33Y 80/00 |
| 2019/0269223 A1* | 9/2019 | Harding | B25J 11/008 |

\* cited by examiner

| 1202 | 1204 | 1206 | 1208 | 1210 | 1212 | 1214 |
|---|---|---|---|---|---|---|
| PROFILE (S, U, D) | FULLNESS (B, D, E) | CURL (C, D, L+) | LASH TYPE (S, M) | LASH LENGTH (IN mm) | LASH THICKNESS (IN mm) | APPLICATION METHOD (C, MV) |

SYSTEMS AND METHODS FOR CREATING CUSTOM LASH DESIGN

FIELD

The present disclosure is directed to systems and methods for creating a custom lash design. More particularly, the present disclosure is directed to systems and methods for creating a custom lash design based on the features of an eye captured in an image.

BACKGROUND

False eyelashes, also referred to as false lashes, are being more frequently used to enhance the appearance of natural lashes. False lashes may be used for aesthetic purposes as well as for medical purposes, such as alopecia. Aesthetically, false lashes can add definition, length, and volume to natural lashes. One type of application of false lashes involves strips of synthetic lashes. The strips may be backed with adhesive for adhering to the eye lid. These types of false lashes may be heavier than desired. Further, the application of these types of false lashes may be messier, more difficult, and not as natural looking as desired.

Another type of application involves applying individual false lashes to natural lashes. Specifically, each individual false lash is adhered to a natural lash. But determining what types of lashes and the lengths of lashes are to be used may be more difficult and time-consuming than desired given that eye shape and personal preferences can vary so greatly. Thus, systems and methods for improving the application of false lashes are needed.

SUMMARY

In one embodiment, a method is provided for improving lash application. An eye profile and a point of emphasis are identified for an eye using an image of the eye. A lash framework is generated based on the eye profile and the point of emphasis. A custom lash design is created using the lash framework. The custom lash design is used for physical application of a set of lashes to the eye.

In another embodiment, a method implemented on a mobile device is provided for improving lash application. An eye profile and a point of emphasis are identified for an eye using an image of the eye. A lash framework is generated based on the eye profile and the point of emphasis. A custom lash design is created using the lash framework. The custom lash design is used for physical application of a set of lashes to the eye. A series of instructions are generated based on the custom lash design to aid in the physical application of the set of lashes to the eye.

In yet another embodiment, a system comprises a processor. The processor is configured to identify an eye profile and a point of emphasis for an eye using an image of an eye. The processor is configured to generate a lash framework based on the eye profile and the point of emphasis. The processor is configured to create a custom lash design using the lash framework. The custom lash design is used for physical application of a set of lashes to the eye.

It is to be understood that both the foregoing general description and the following detailed description are exemplary and explanatory in nature and are intended to provide an understanding of the present disclosure without limiting the scope of the present disclosure. In that regard, additional aspects, features, and advantages of the present disclosure will be apparent to one skilled in the art from the following detailed description.

BRIEF DESCRIPTIONS OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. In addition, the present disclosure may repeat reference numerals and/or letters in the various examples. This repetition is for the purpose of simplicity and clarity and does not in itself dictate a relationship between the various embodiments and/or configurations discussed.

FIG. 12 is an illustration of a custom code structure, in accordance with an embodiment.

DETAILED DESCRIPTION

The example embodiments described below provide systems and methods for improving lash application (i.e. eyelash application). For example, a lash design system is provided for creating a custom lash design to be used in the application of false lashes. The lash design system uses the mapping of facial features to identify the lash design that is most complimentary for a person's eyes. This lash design is then customized based on selected preferences to define a custom lash design that can be used to guide the physical application of the false lashes. The lash design system reduces the level of expertise and time required of technicians to be trained on how to create custom lash designs and to create custom lash designs.

Further, a method for improving lash application is provided. In one or more example embodiments, this method may be implemented using a mobile device (e.g., smartphone, tablet, etc.). In other example embodiments, this method may be implemented manually by a human operator. The method includes mapping facial features to identify the lash design that is most complimentary for a person's eyes. This lash design is then customized based on selected preferences to define a custom lash design that can be used to guide the physical application of the false lashes. Using this type of method may reduce the level of expertise and time required of technicians during training on how to create custom lash designs. Further, this type of method may reduce the level of expertise and time required of technicians to create custom lash designs.

Figure 1:
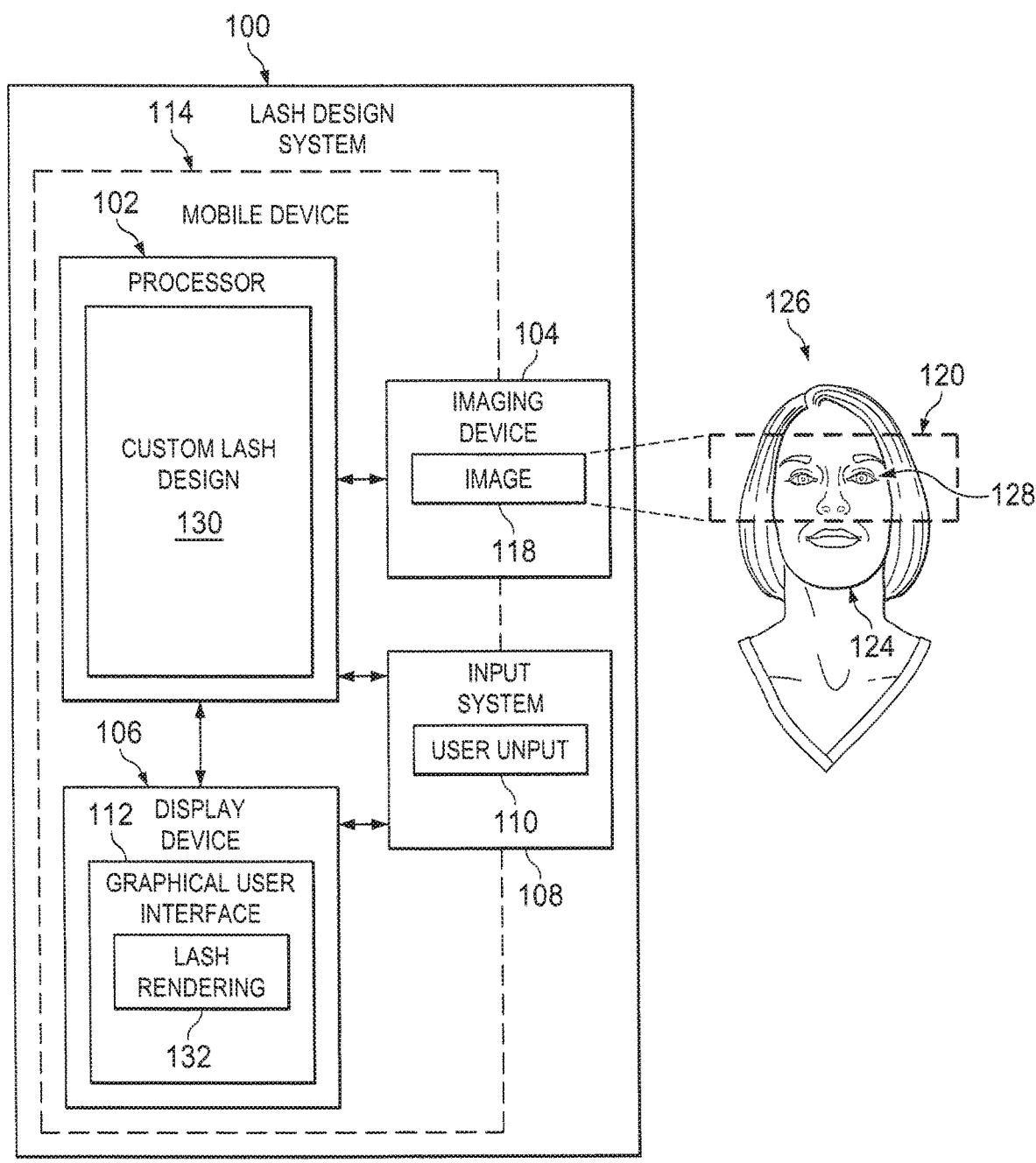
FIG. 1 is a schematic diagram of a lash design system for generating a custom lash design, in accordance with an embodiment.

Referring now to the drawings, FIG. 1 is a schematic diagram of a lash design system 100 for generating a custom lash design. The lash design system 100 includes a processor 102, an imaging device 104, a display device 106, and an input system 108. The imaging device 104, the display device 106, and the input system 108 are in communication with the processor 102. In some embodiments, the imaging device 104, the display device 106, and the input system 108 may also be in communication with each other.

The imaging device 104 may be, for example, a camera. The input system 108 may include any number of input devices for receiving user input 110. For example, the input system 108 may include at least one of a mouse, a joystick, a keyboard, or some other type of input device. The display device 106 may be, for example, a monitor, a touchscreen, a projector and screen, or some other type of display device. In some embodiments, at least a portion of the input system 108 may be integrated as part of the display device 106. For example, the display device 106 may be a touchscreen that is capable of receiving the user input 110.

In one or more embodiments, a graphical user interface 112 is displayed on the display device 106. The graphical user interface 112 is used to obtain the user input 110.

In one example embodiment, the processor 102, the imaging device 104, and the display device 106 are implemented within a mobile device 114. In other embodiments, the imaging device 104 may be considered separate from the mobile device 114. In some cases, the display device 106 or a portion of the display device 106 may be considered separate from the mobile device 114. The mobile device 114 may take the form of, for example, a smartphone, a tablet, a wearable mobile device (e.g., a smart watch), or some other type of mobile device. In some embodiments, the imaging device 104 may be a camera that is independent of and not physically coupled to the mobile device 114. In other embodiments, the processor 102 may be independent of and not physically coupled to the mobile device 114. For example, the processor 102 may be a centralized processor in communication with the mobile device 114.

The imaging device 104 is used to capture an image 118 of at least a portion 120 of a face 124 of a person 126. Specifically, the imaging device 104 may be used to capture the portion 120 of the face 124 that includes the eyes 128 of the person 126. This image 118 is processed by the processor 102. In some embodiments, the processor 102 may receive the image 118 from a source other than the imaging device 104. For example, the processor 102 may retrieve the image 118 from a database, a cloud, a server system, or some other type of memory, storage, or other source.

The processor 102 uses the image 118 to generate a custom lash design 130 for the person 126. In one or more embodiments, the processor 102 uses the custom lash design 130 to generate a lash rendering 132 that is displayed through the graphical user interface 112 on the display device 106. The lash rendering 132 may include a rendering for each of the eyes 128. The lash rendering 132 for a particular eye is a visual representation of how a set of lashes applied according to the custom lash design 130 looks in relation to the corresponding eye in the image 118. In some embodiments, the lash rendering 132 that is displayed is changed in response to the user input 110. For example, the lash rendering 132 may change in response to user input 110 indicating a change from one level of fullness for the lashes to another level of fullness. The methods used to create the custom lash design 130 are described in greater detail in the figures further below.

In other embodiments, the processor 102 may be a centralized processor that receives the image 118 and processes the image 118 to generate the custom lash design 130. The processor 102 may then send the custom lash design 130 to a remote device. The remote device may be the mobile device 114 in some embodiments. For example, the processor 102 may send the custom lash design 130 to the mobile device 114 for display on the display device 106 of the mobile device 114. In other example embodiments, the remote device may be a server system that stores the custom lash design 130 for future use. In still other example embodiments, the remote device may be a different processor that further processes the custom lash design 130 or uses the custom lash design 130 to perform another task.

Figure 2:
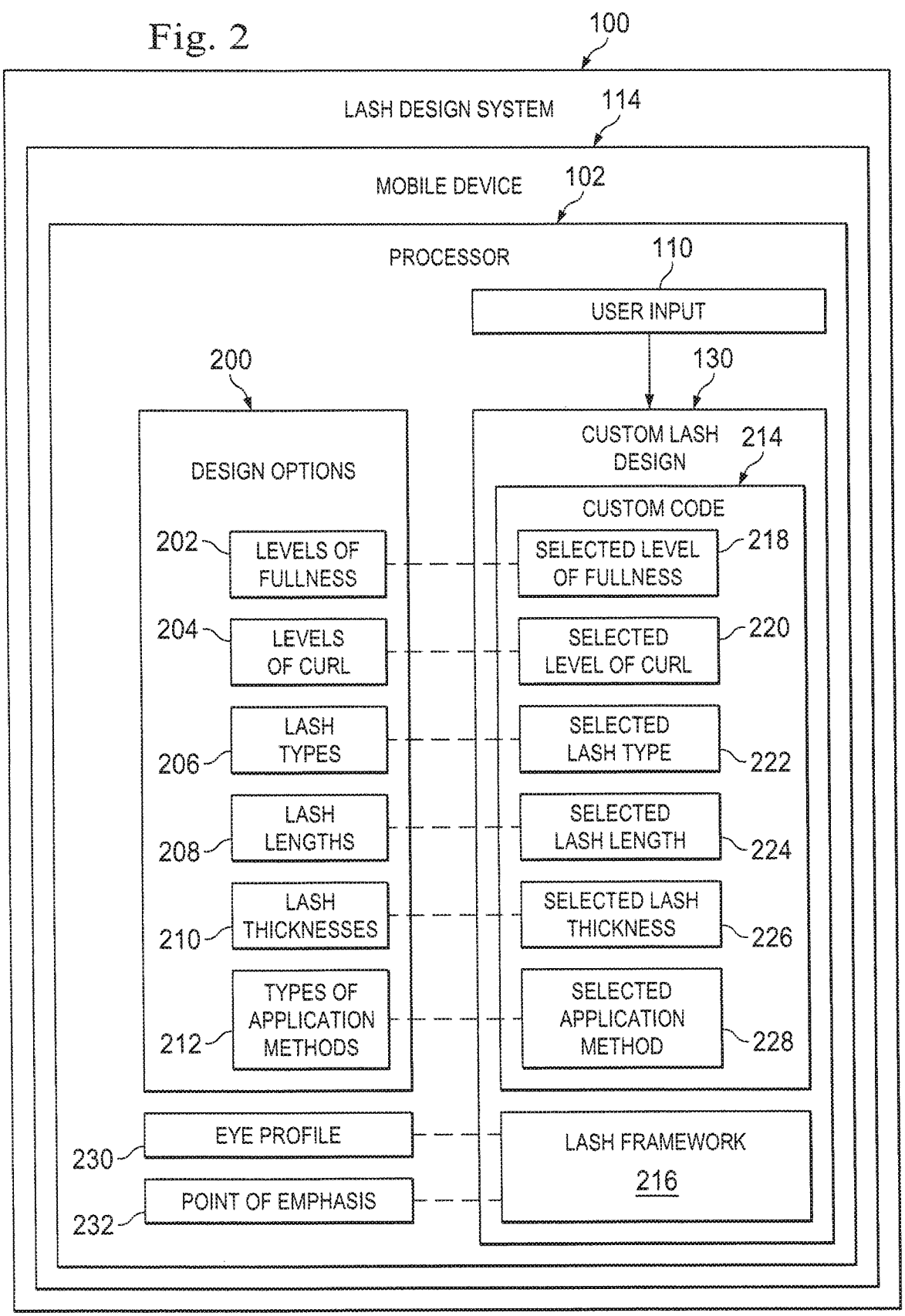
FIG. 2 is a schematic diagram illustrating the information used by the processor from FIG. 1 to define the various elements of the custom lash design, in accordance with an embodiment.

FIG. 2 is a schematic diagram illustrating the information used by the processor 102 to define the various elements of the custom lash design 130 from FIG. 1. The information used by the processor 102 to create the custom lash design 130 may include the user input 110 as well as design options 200. In one or more embodiments, the design options 200 identify the various options available for the sets of lashes to be used for the eyes 128 in FIG. 1. The user input 110 may include user-specified design selections of or based on one or more of the design options 200.

For example, the processor 102 may visually present the design options 200 in the graphical user interface 112 described in FIG. 1. In one or more embodiments, the processor 102 displays at least one of prompts, graphical indicators, or graphical controls for use in obtaining the user input 110.

The design options 200 may include, for example, levels of fullness 202, levels of curl 204, lash types 206, lash lengths 208, lash thicknesses 210, and types of application methods 212. The levels of fullness 202 may include, for example, a basic level, a dramatic level, and an extreme level, listed in order of increasing fullness. In other embodiments, the levels of fullness 202 may include one or more different levels. The levels of curl 204 may include, for example, a soft curl, a tight curl, and a combination curl. In one or more embodiments, the combination curl may refer to a straight portion combined with a curly portion. The lash types 206 may include, for example, a silk type, a mink type, and a synthetic type.

The lash lengths 208 include the possible lengths for the various lashes used. In one example embodiment, the lash lengths 208 include 6 millimeters, 7 millimeters, 8 millimeters, 9 millimeters, 10 millimeters, 11 millimeters, 12 millimeters, 13 millimeters, 14 millimeters, and 15 millimeters. In other embodiments, the lash lengths 208 may include only a portion of these lengths or other lengths in addition to or in place of these lengths. The lash thicknesses 210 include the possible thicknesses for the various lashes used. In one example embodiment, the lash thicknesses 210 include 0.06 millimeters, 0.07 millimeters, 0.10 millimeters, 0.15 millimeters, and 0.18 millimeters. In other embodiments, the lash thicknesses 210 may include only a portion of these lengths or other lengths in addition to or in place of these thicknesses.

The types of application methods 212 include the different types of methods that may be used to apply the lashes to the eyes 128 in FIG. 1. In one embodiment, the types of application methods 212 include a classic method and a multi-volume method. The classic method may include applying 1 false lash to every 1 natural lash. The multi-volume method may include applying at least two false lashes to every 1 natural lash.

The processor 102 generates the custom lash design 130 based on the selections from the design options 200 made via the user input 110 and on a lash framework 216. For example, the custom lash design 130 may include a custom code 214 based on the design options 200 and the lash framework 216. The custom code 214 identifies at least one of a selected level of fullness 218, a selected level of curl 220, a selected lash type 222, a selected lash length 224, a selected lash thickness 226, or a selected application method 228 for each set of lashes to be applied to the eyes 128 described in FIG. 1. The selected level of fullness 218, the selected level of curl 220, the selected lash type 222, the selected lash length 224, the selected lash thickness 226, and the selected application method 228 may be selected via the user input 110 from the levels of fullness 202, the levels of curl 204, the lash types 206, the lash lengths 208, the lash thicknesses 210, and the types of application methods 212, respectively.

The selected lash length 224 may be a maximum lash length. In other words, the selected lash length 224 may define the maximum length of lashes to be used. This maximum lash length also determines the minimum lash length used, as well as the spread of lengths used for the set of lashes. The selected lash thickness 226 may determine the thickness for all the lashes used in a set of lashes. In other embodiments, however, the selected lash thickness 226 determines the spread of thicknesses to be used. For example, the selected lash thickness 226 may define a maximum thickness and the set of lashes may be designed to have multiple thicknesses up to the maximum thickness.

The lash framework. 216 is a mapping of the placement for each lash that is to be applied to the eyes 128 described in FIG. 1. This mapping identifies which lengths of lashes to use and where lashes of the varying lengths are to be placed relative to each of the eyes 128. The lash framework 216 is initially created based on the image 118 of the eyes 128. More specifically, the lash framework 216 is created based on an eye profile 230 and a point of emphasis 232 for each of the eyes 128 based on the image 118. The lash framework 216 is then refined using the custom code 214 to form the custom lash design 130.

Figure 3:
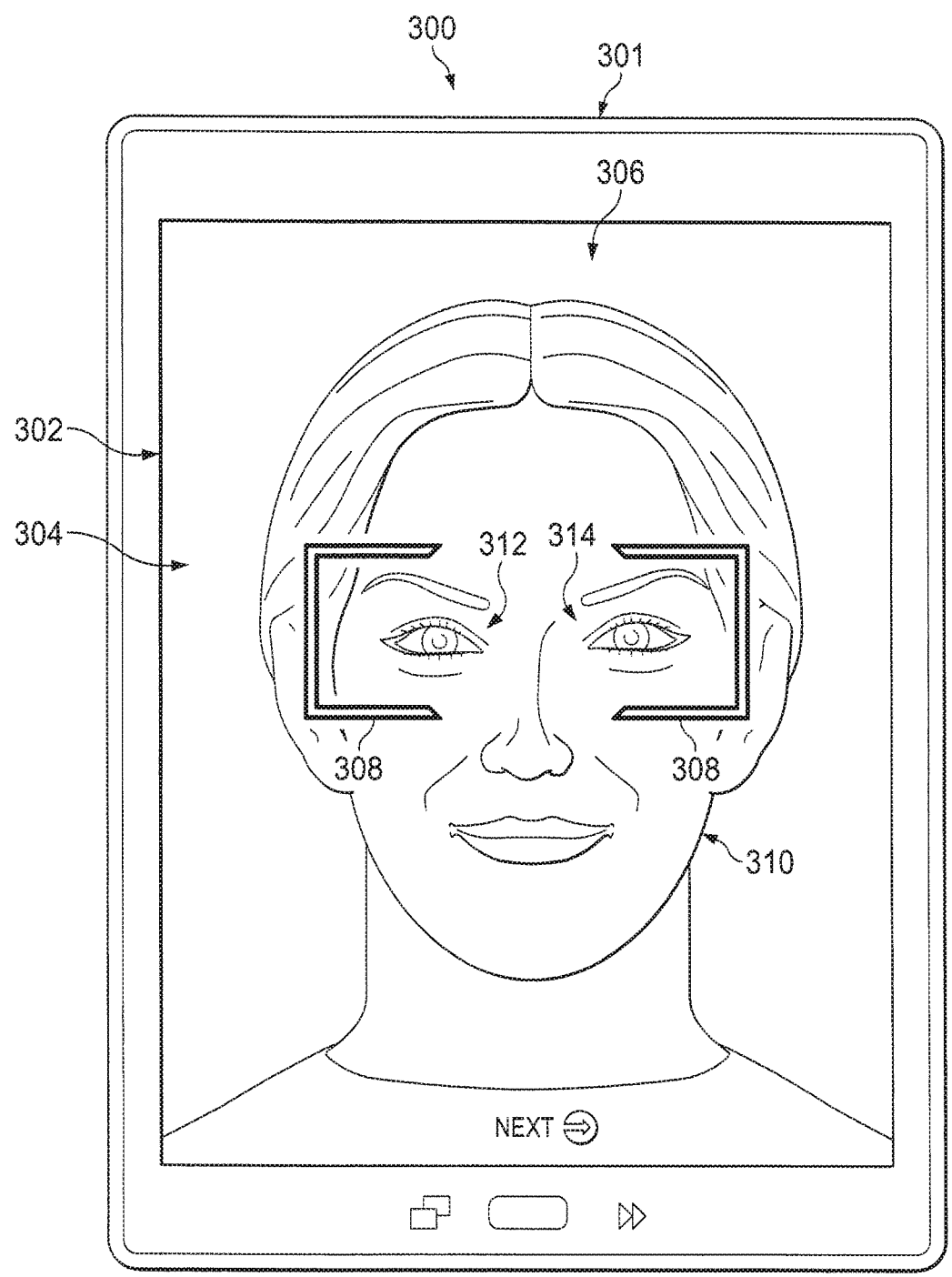
FIG. 3 is an illustration of a lash design system, in accordance with an embodiment.

FIG. 3 is an illustration of a lash design system 300. The lash design system 300 is an example of one implementation for the lash design system 100 in FIG. 1. As illustrated, the lash design system 300 is implemented using a mobile device 301, which is an example of one implementation for the mobile device 114 described in FIG. 1. In this embodiment, the mobile device 301 is a tablet.

The mobile device 301 includes a touchscreen 302 and a graphical user interface 304 displayed on the touchscreen 302. The touchscreen 302 is an example of one implementation for the display device 106 described in FIG. 1. The graphical user interface 304 is an example of one implementation for the graphical user interface 112 described in FIG. 1

An imaging device (not shown in this view) associated with the mobile device 301 may be used to capture an image 306 of a client who will be receiving the false lashes. The image 306 is displayed in the graphical user interface 304. Prior to the capture of the image 306, brackets 308 may be used to help align the client's face 310 in a manner that allows an optimal mapping of the client's facial features. For example, brackets 308 indicate where a first eye 312 and a second eye 314 of the client should be aligned prior to the capture of the image 306.

The lash design system 300 uses the facial features captured in the image 306 to identify an eye profile and a point of emphasis for each of the first eye 312 and the second eye 314. Typically, the eye profile is the same for both the first eye 312 and the second eye 314. Examples of different eye profiles are described in FIG. 4 below. An example of one method for identifying an eye profile is described in FIG. 23 below.

Further, the lash design system 300 uses the facial features captured in the image 306 to identify a point of emphasis for each of the first eye 312 and the second eye 314. The point of emphasis determines the placement for the lash having the maximum length. An example of one method for identifying a point of emphasis is described in FIG. 23 below.

Figure 4:
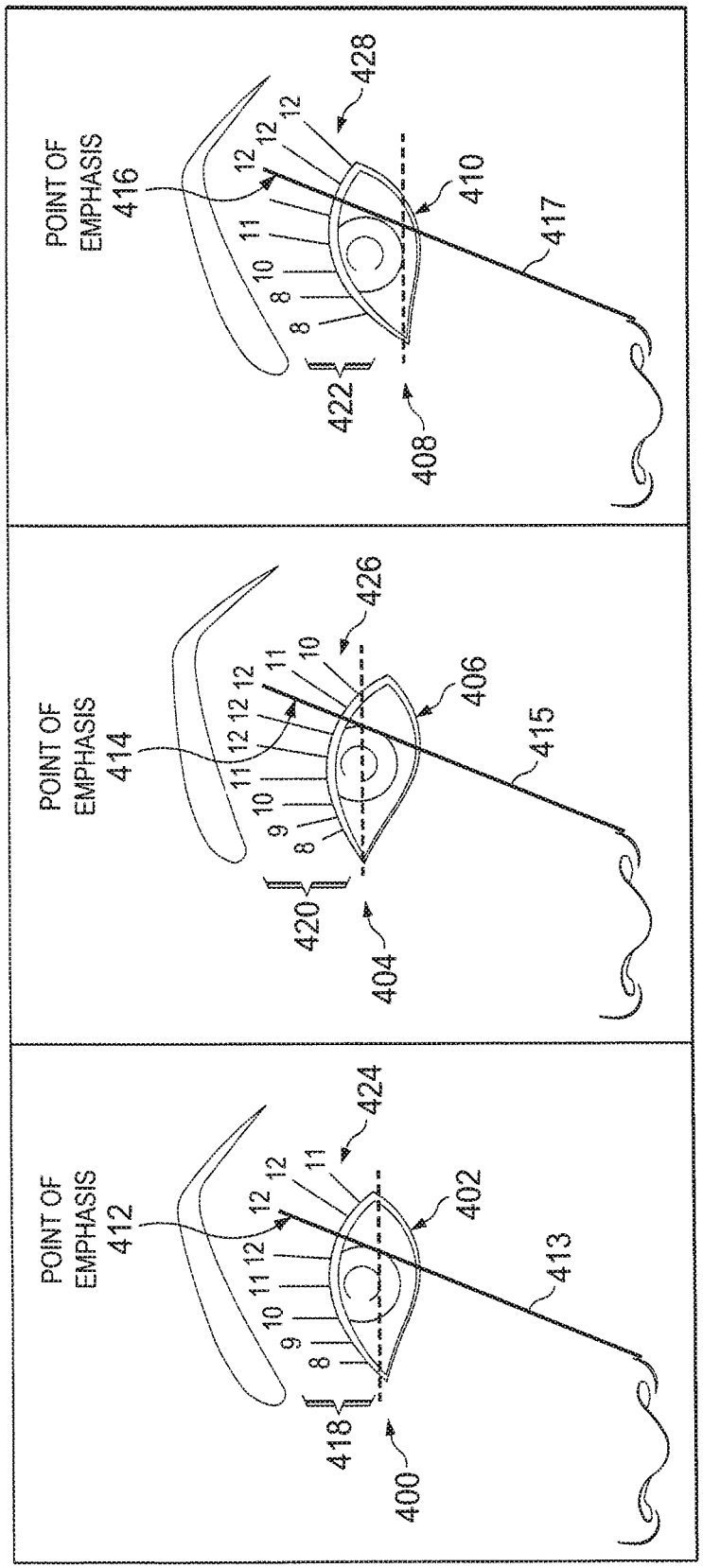
FIG. 4 is an illustration of lash frameworks generated for different eye profiles, in accordance with an embodiment.

FIG. 4 is an illustration of lash frameworks generated for different eye profiles. An eye 400 has a straight profile 402. An eye 404 has a downward profile 406. An eye 408 has an upward profile 410. A point of emphasis 412 is identified along a line 413 for the eye 400. A point of emphasis 414 is identified along a line 415 for the eye 404. Further, a point of emphasis 416 is identified along a line 417 for the eye 408. Each of the lines 413, 415, and 417 is an imaginary line that connects an outer edge of the nostril adjacent the corresponding eye to an outer edge of the iris of the corresponding eye. In some embodiments, each of the lines 413, 415, and 417 may be referred to as a line of emphasis.

In one embodiment, each of the points of emphasis 412, 414, and 416 is a point positioned at or just above the natural lash line or the boundary between the corresponding eye line and the corresponding eyelid. In other embodiments, each of the points of emphasis 412, 414, and 416 may be any point on the eyelid that is along the respective lines 413, 415, and 417.

A lash framework 418, a lash framework 420, and a lash framework 422 are generated for the eye 400, the eye 404, and the eye 408, respectively. Each of the lash frameworks 418, 420, and 422 defines the placement for framing lashes. These framing lashes are the spaced apart lashes that will be applied in a first pass. The framing lashes serve as guide for application of the remaining lashes. The lash framework 418 includes a set of individual framing lashes 424. The lash framework 420 includes a set of individual framing lashes 426. The lash framework 422 includes a set of individual framing lashes 428.

Each of the set of individual framing lashes 424, the set of individual framing lashes 426, and the set of individual framing lashes 428 includes a framing lash that is anchored to the corresponding point of emphasis 412, the corresponding point of emphasis 414, and the corresponding point of emphasis 416, respectively. This particular framing lash may also be referred to as an emphasis lash, a point of emphasis lash, or an anchor lash.

Each of the lash framework 418, the lash framework 420, and the lash framework 422 indicates that a lash having the maximum length (e.g., 12 millimeters) is to be placed, or applied, at the position of the corresponding point of emphasis. In one or more embodiments, when the point of emphasis is a point positioned at or just above the interface between the corresponding eye and the corresponding eyelid, placing the lash at the point of emphasis may include applying the lash such that an end or base of the lash is positioned at the point of emphasis. In some embodiments, placing or applying a lash at the position of a point of emphasis may include placing the lash in general alignment with the line along which the point of emphasis lies. For example, applying a lash at the point of emphasis 412 may include applying the lash such that the lash generally aligns with the line 413.

As depicted, the lash frameworks 418, 420, and 422 define the length for each individual framing lash. For the eye 400 having the straight profile 402, the lash framework 418 indicates that one lash having the maximum length (e.g., 12 millimeters.) is to be placed at the corresponding point of emphasis 412 and at least two lashes having the maximum length are to be placed on either side of the point of emphasis 412. For the eye 404 having the downward profile 406, the lash framework 420 indicates that one lash having the maximum length (e.g., 12 millimeters) is to be placed at the corresponding point of emphasis 414 and at least two lashes having the maximum length are to be placed inside of the corresponding point of emphasis 414. For the eye 408 having the upward profile 410, the lash framework 422 indicates that one lash having the maximum length (e.g., 12 millimeters) is to be placed at the point of emphasis 416 and at least two lashes having the maximum length are to be placed outside of the corresponding point of emphasis 416. As used herein, "inside" of a point of emphasis means towards the inside inner corner) of the corresponding eye, while "outside" of the point of emphasis means towards the outside (e.g., outer corner) of the corresponding eye.

Thus, different lash frameworks are generated for eyes with different profiles. The lash frameworks 418, 420, and 422 described above may be generated based on what is considered most complimentary or aesthetically pleasing for the profiles of the respective eyes 400, 404, and 408. The point of emphasis identified for each of these eyes helps to anchor the overall lash design. The final custom lash design includes lashes placed in between the framing lashes.

Although the lash frameworks 418, 420, and 422 are generated for the straight profile 402, the downward profile 406, and the upward profile 410, respectively, one or more of these lash frameworks may be similarly well-suited for other eye profiles. In some embodiments, the characteristics of both the left and right eyes of a person may be considered in determining the complimentary lash framework for each of the left and right eyes. For example, if the person has close-set eyes or wide-set eyes, a particular lash framework may be selected for each eye irrespective of the actual profile of each eye. In one example embodiment, if the person has close-set eyes, the lash framework 422 that is typically used for eyes with the upward profile 410 may be used, regardless of whether the eyes actually have the upward profile 410. In some cases, if the person has wide-set eyes, the lash framework 420 that is typically used for eyes with the downward profile 406 may be used, regardless of whether the eyes actually have the downward profile 406.

Further, the above-described lash frameworks 418, 420, and 422 are just some examples of possible configurations for lash frameworks. Other configurations are also possible depending on the shape or profile of the eye and the maximum length selected for the lashes.

Figure 5:
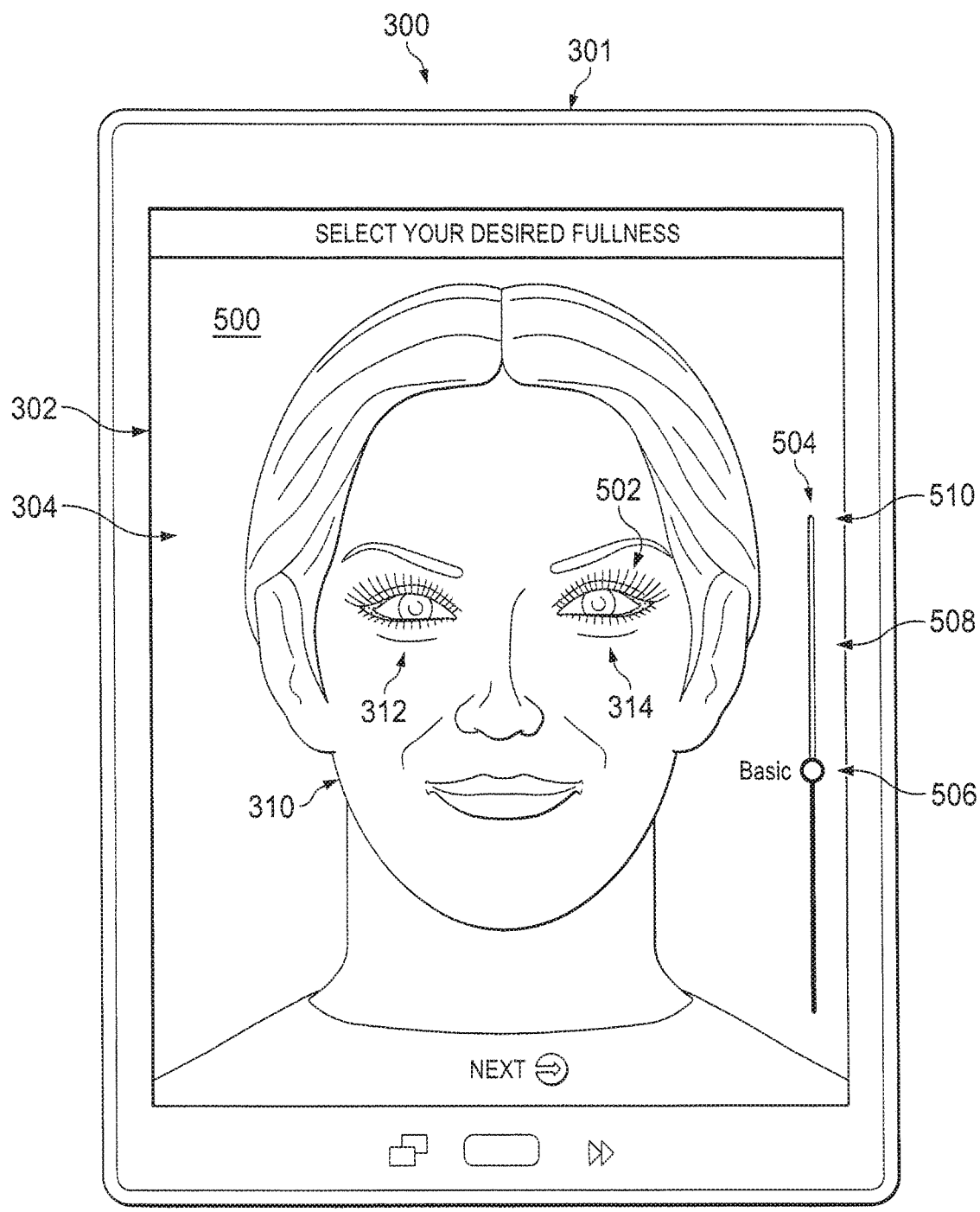
FIG. 5 is an illustration of a lash rendering displayed in the graphical user interface, in accordance with an embodiment.

FIG. 5 is an illustration of a lash rendering 502 displayed in the graphical user interface 304 from FIG. 3. A modified image 500 is displayed in the graphical user interface 304. The modified image 500 is the image 306 from FIG. 3 modified to include a lash rendering 502. The lash rendering 502 is a visual representation of how lashes applied according to a custom lash design look in relation to the first eye 312 and the second eye 314. The lash rendering 502 may, for example, present the lash design that best compliments each of the first eye 312 and the second eye 314. The lash design may be created to provide symmetry between the first eye 312 and the second eye 314.

A graphical control 504 is also displayed in the graphical user interface 304. In one or more embodiments, the graphical control 504 may be a slide bar. In other embodiment, the graphical control 504 may be one or more buttons, a toggle control, or some other type of graphical control. The graphical control 504 allows for user input to select a level of fullness for lash rendering 502, and thereby the corresponding set of lashes to be applied. Fullness is determined by the number of lashes to be added to the eye.

In one example embodiment, the graphical control 504 may be a slide bar that can be slid to one of three positions: a first position 506, a second position 508, and a third position 510. The first position 506 may correspond to a basic level of fullness. The second position 508 may correspond to a dramatic level of fullness. The third position 510 may correspond to an extreme level of fullness.

In FIG. 5, the graphical control 504 has been set to the first position 506 and the lash rendering 502 represents a set of lashes having the basic level of fullness. In one example embodiment, the basic level of fullness indicates that between about 60 to 70 lashes are to be added per eye. In some cases, the number of lashes within this range (e.g., 60, 65, or 70) added per eye may be determined based on the skill level or experience of the technician or person applying the lashes.

Figure 6:
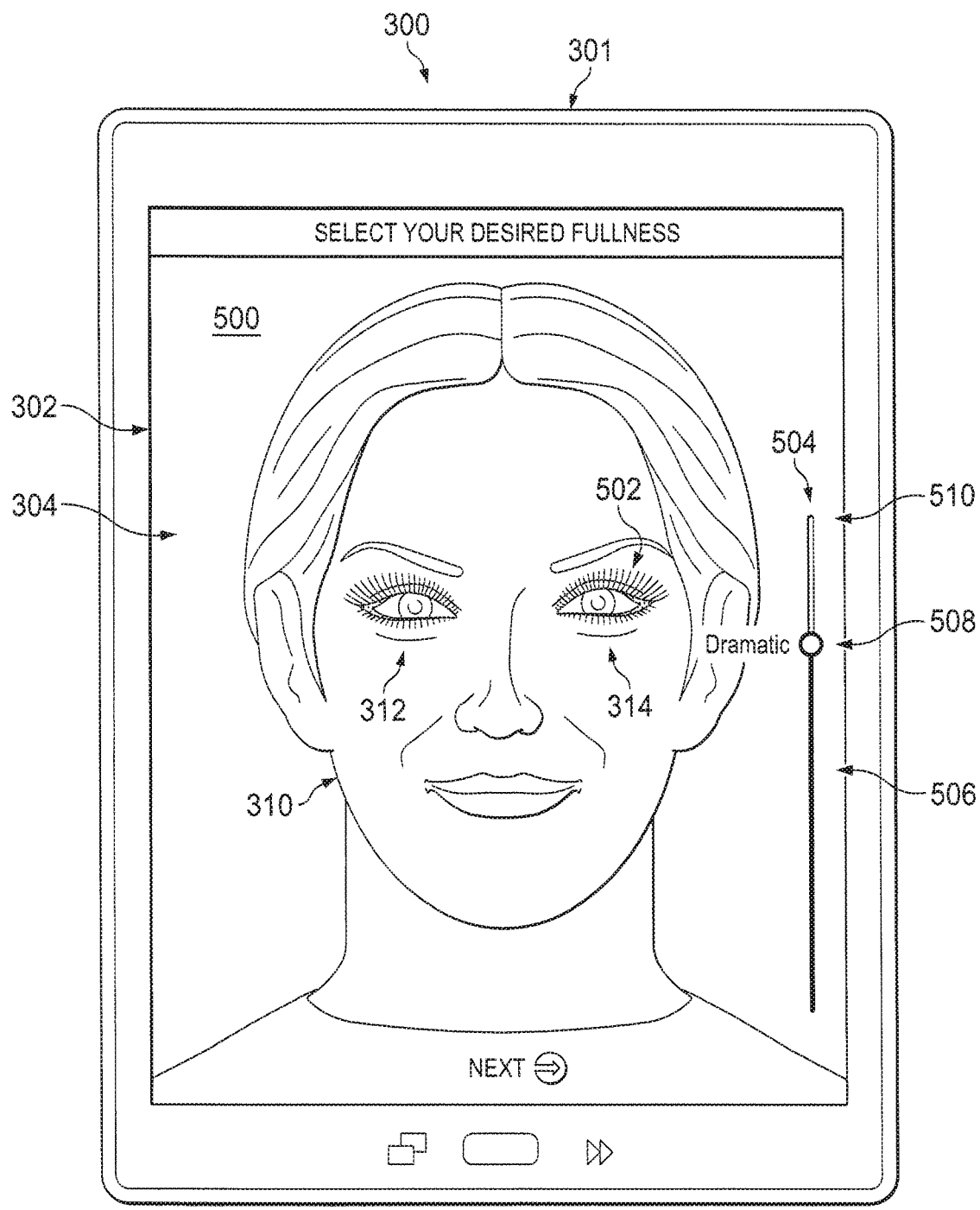
FIG. 6 is an illustration of the lash rendering from FIG. 5 corresponding to a dramatic level of fullness, in accordance with an embodiment.

FIG. 6 is an illustration of the lash rendering 502 corresponding to a dramatic level of fullness. Moving the graphical control 504 from the first position 506 to the second position 508 causes the lash rendering 502 to change. In FIG. 6, the lash rendering 502 has been changed to represent a set of lashes having the dramatic level of fullness. The dramatic level of fullness may provide about 25 percent more fullness than the basic level of fullness.

In one example embodiment, the dramatic level of fullness indicates that between about 75 to 85 lashes are to be added per eye. In some cases, the number of lashes within this range (e.g., 75, 80, or 85) added per eye may be determined based on the skill level of experience of the technician or person applying the lashes.

Figure 7:
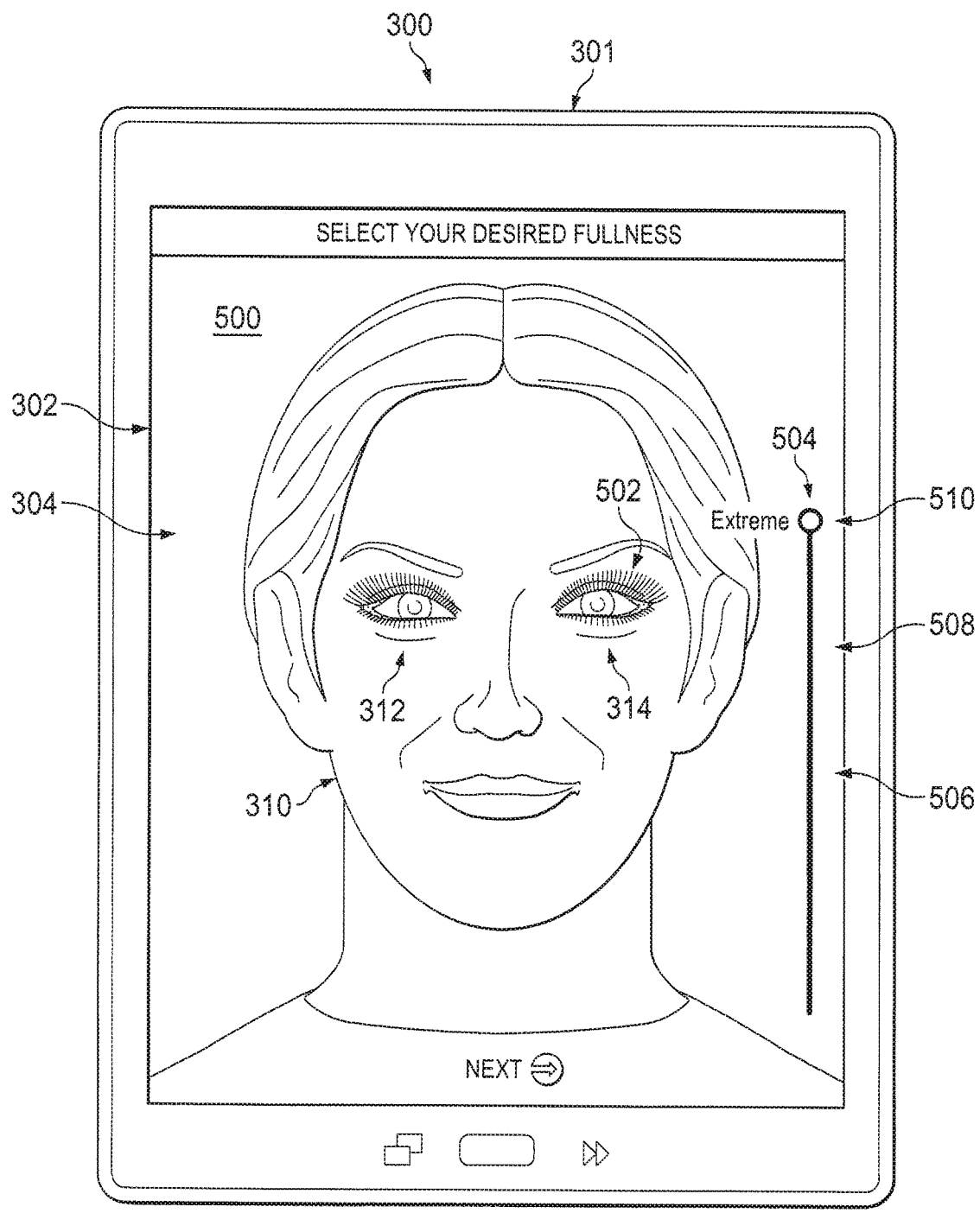
FIG. 7 is an illustration of the lash rendering from FIG. 5 corresponding to an extreme level of fullness, in accordance with an embodiment.

FIG. 7 is an illustration of the lash rendering 502 corresponding to an extreme level of fullness. Moving the graphical control 504 from the second position 508 to the third position 510 causes the lash rendering 502 to change. In FIG. 7, the lash rendering 502 has been changed to represent a set of lashes having the extreme level of fullness. The extreme level of fullness may provide about 50 percent more fullness than the basic level of fullness.

In one example embodiment, the extreme level of fullness indicates that between about 90 to 100 lashes are to be added per eye. In some cases, the number of lashes within this range (e.g., 90, 95, or 100) added per eye may be determined based on the skill level or experience of the technician or person applying the lashes.

Figure 8:
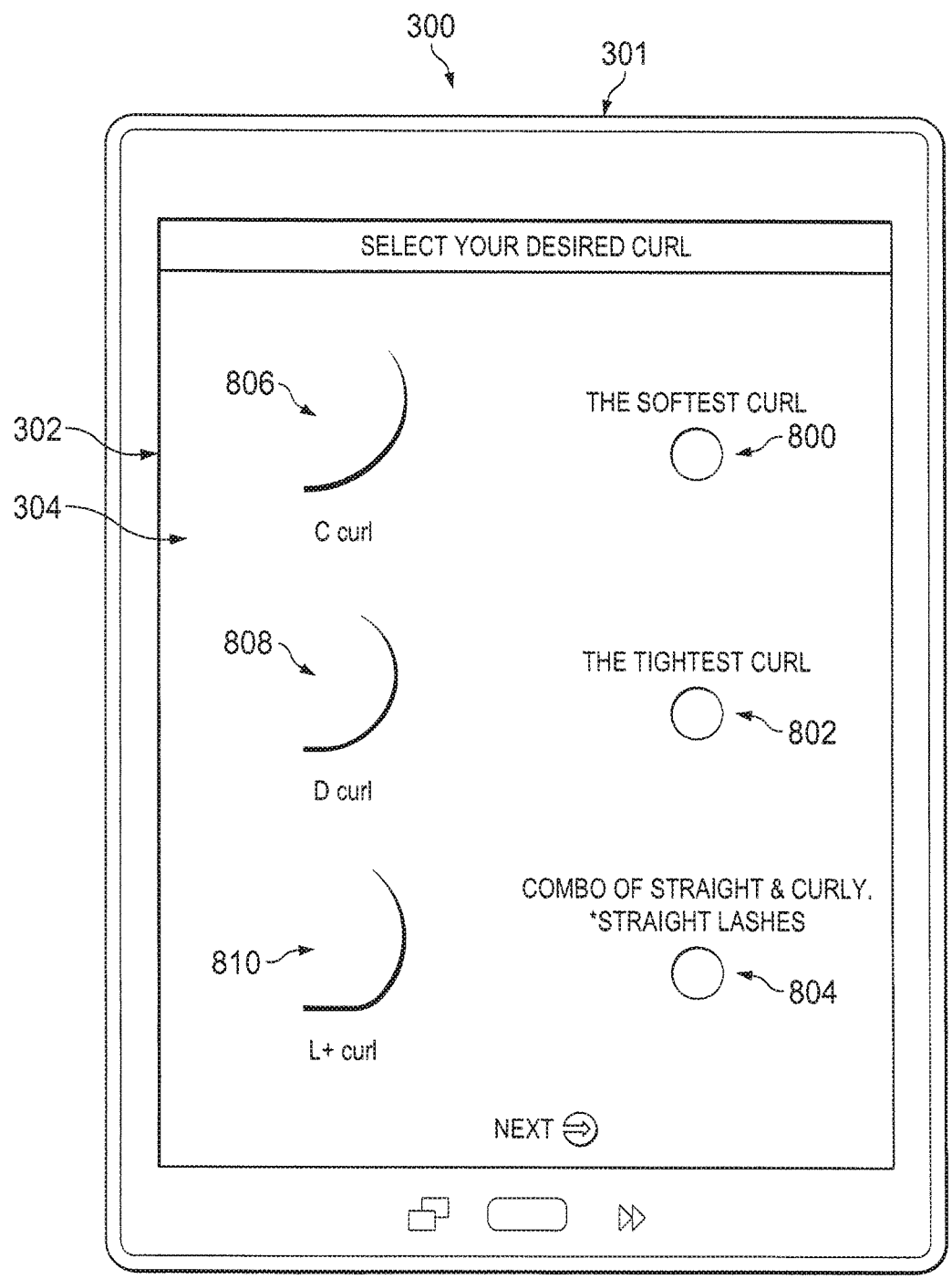
FIG. 8 is an illustration of options for levels of curl displayed in the graphical user interface, in accordance with an embodiment.

FIG. 8 is an illustration of options for levels of curl displayed in the graphical user interface 304. The level of curl may refer to the shape or profile of the lash. A soft curl control 800, a tight curl control 802, and a combination curl control 804 are displayed in the graphical user interface 304. In one or more embodiments, a soft curl image 806, a tight curl image 808, and a combination curl image 810 may be displayed in association with the soft curl control 800, the tight curl control 802, and the combination curl control 804, respectively. In some embodiments, additional information (e.g., text definitions) may be displayed in association with the soft curl control 800, the tight curl control 802, and the combination curl control 804.

The soft curl control 800, the tight curl control 802, and the combination curl control 804 are graphical controls that allow for user input to select a level of curl. Although these graphical controls are depicted as radio buttons, some other type of graphical control may be used.

Figure 9:
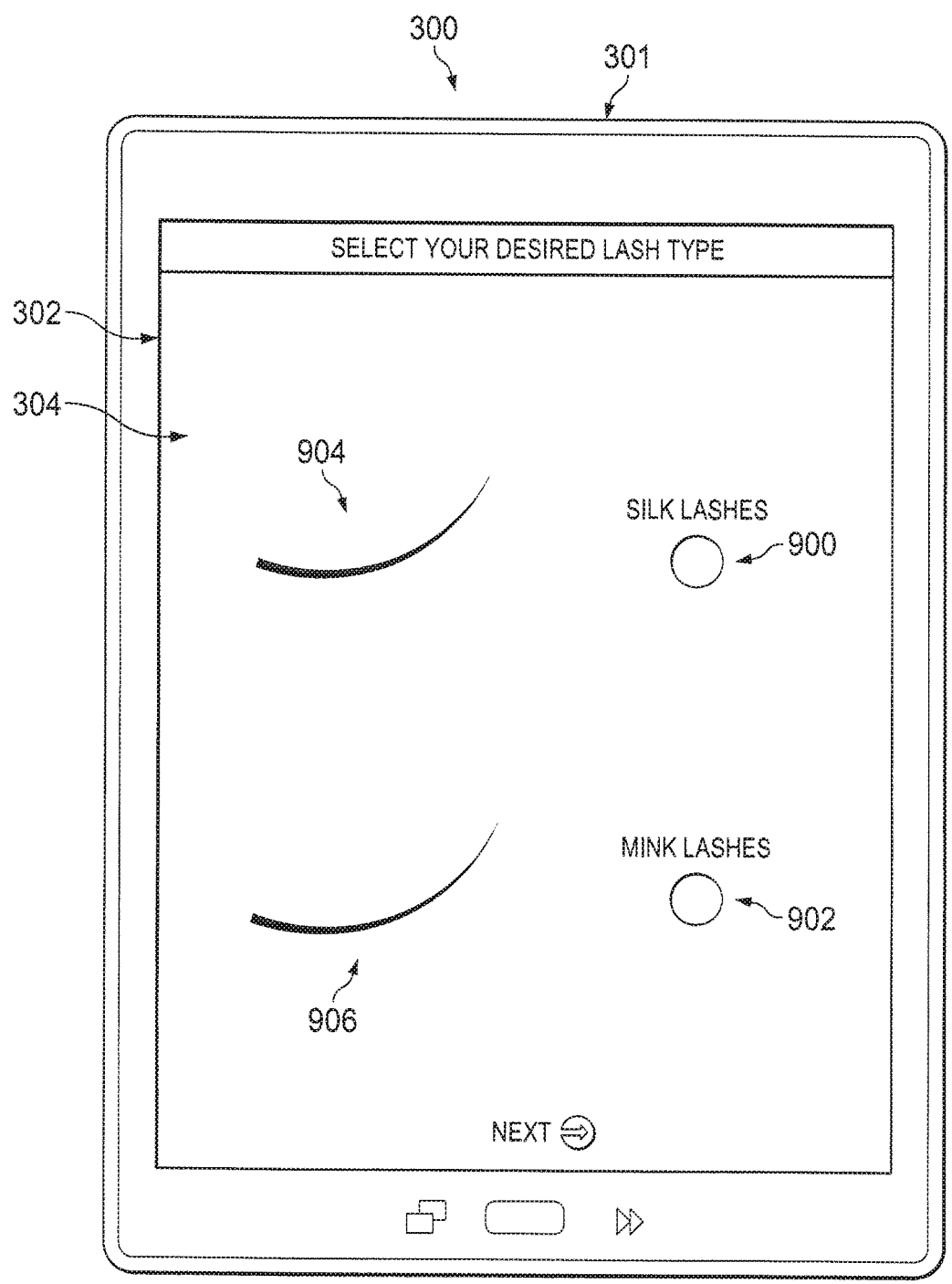
FIG. 9 is an illustration of options for a type of lash displayed in graphical user interface, in accordance with an embodiment.

FIG. 9 is an illustration of options for a type of lash displayed in the graphical user interface 304. The type of lash may refer to one or more characteristics of the lash including the type of material. The lash material may be a synthetic or natural material. Characteristics of the lash may also include, for example, weight, color, finish, and taper. Two types of lashes include silk lashes and mink lashes. Mink lashes may be natural mink lashes or synthetic mink lashes.

A silk type control 900 and a mink type control 902 are displayed in the graphical user interface 304. The silk type control 900 and the mink type control 902 are graphical controls that allow for user input to select either silk lashes or mink lashes, respectively. An image 904 of a lash of a silk type and an image 906 of a lash of a mink type are displayed in association with the silk type control 900 and the mink type control 902, respectively. Although these graphical controls are depicted as radio buttons, some other type of graphical control may be used.

Figure 10:
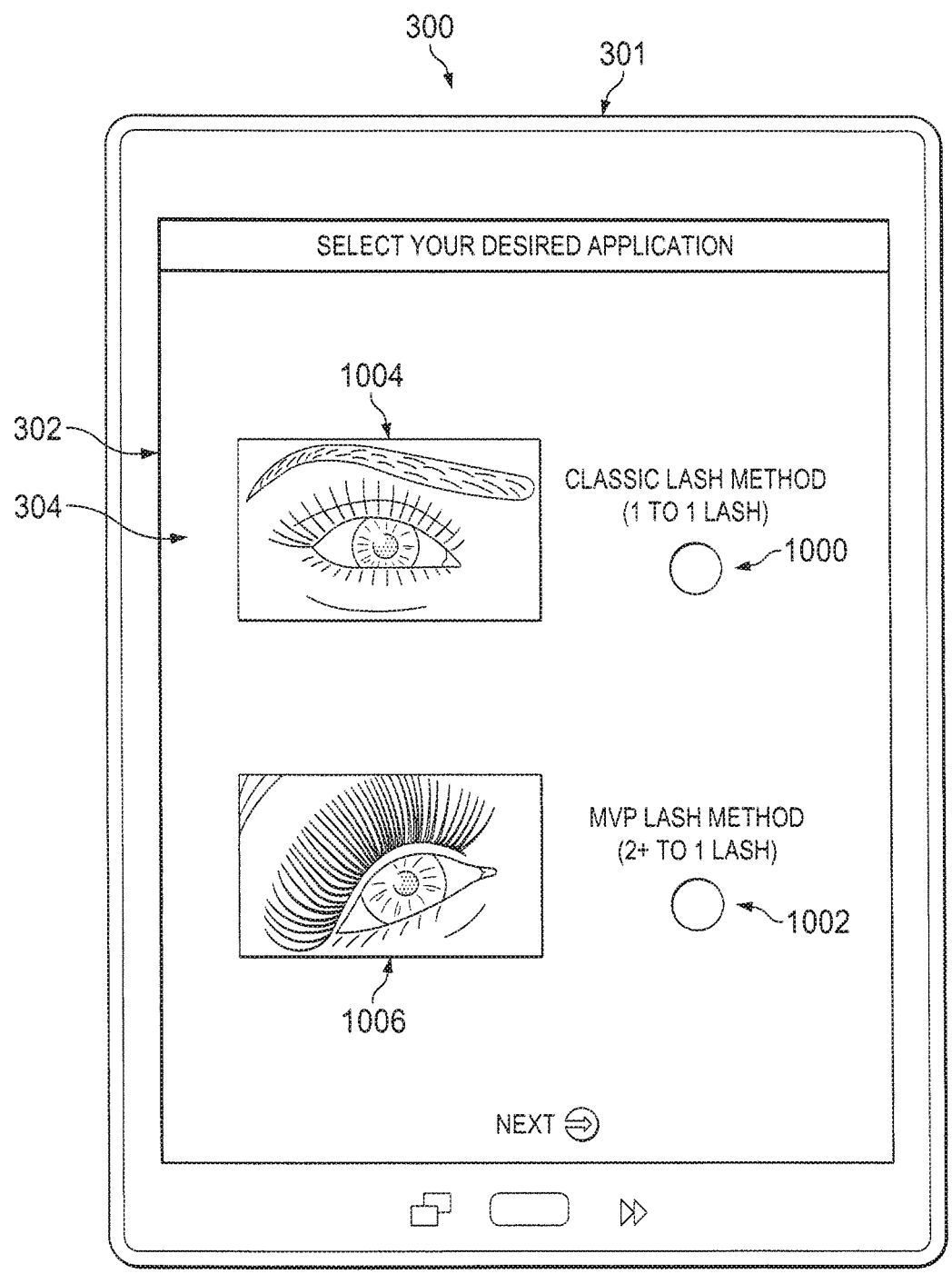
FIG. 10 is an illustration of options for a type of application method displayed in the graphical user interface, in accordance with an embodiment.

FIG. 10 is an illustration of options for a type of application method displayed in the graphical user interface 304. The type of application method may refer to the method or technique used to apply the lashes to the eye. This method or technique may determine, for example, at least one of the number of lashes adhered to otherwise attached to each natural lash of the person, the type of adhesive used during application, the type of tool used for lash application, or some other requirement for lash application. Two types of application methods include a classic application method and a multi-volume application method. With the classic application method, a single lash is adhered to an individual natural lash. With the multi-volume application method, at least two lashes are adhered to an individual natural lash.

A classic application control 1000 and a multi-volume application control 1002 are displayed in the graphical user interface 304. The classic application control 1000 and the multi-volume application control 1002 are graphical controls that allow for user input to select either the classic application method or the multi-volume application method, respectively. An image 1004 representing the classic application method and an image 1006 representing the multi-volume application method are displayed in association with the classic application control 1000 and the multi-volume application control 1002, respectively. Although these graphical controls are depicted as radio buttons, some other type of graphical control may be used.

Figure 11:
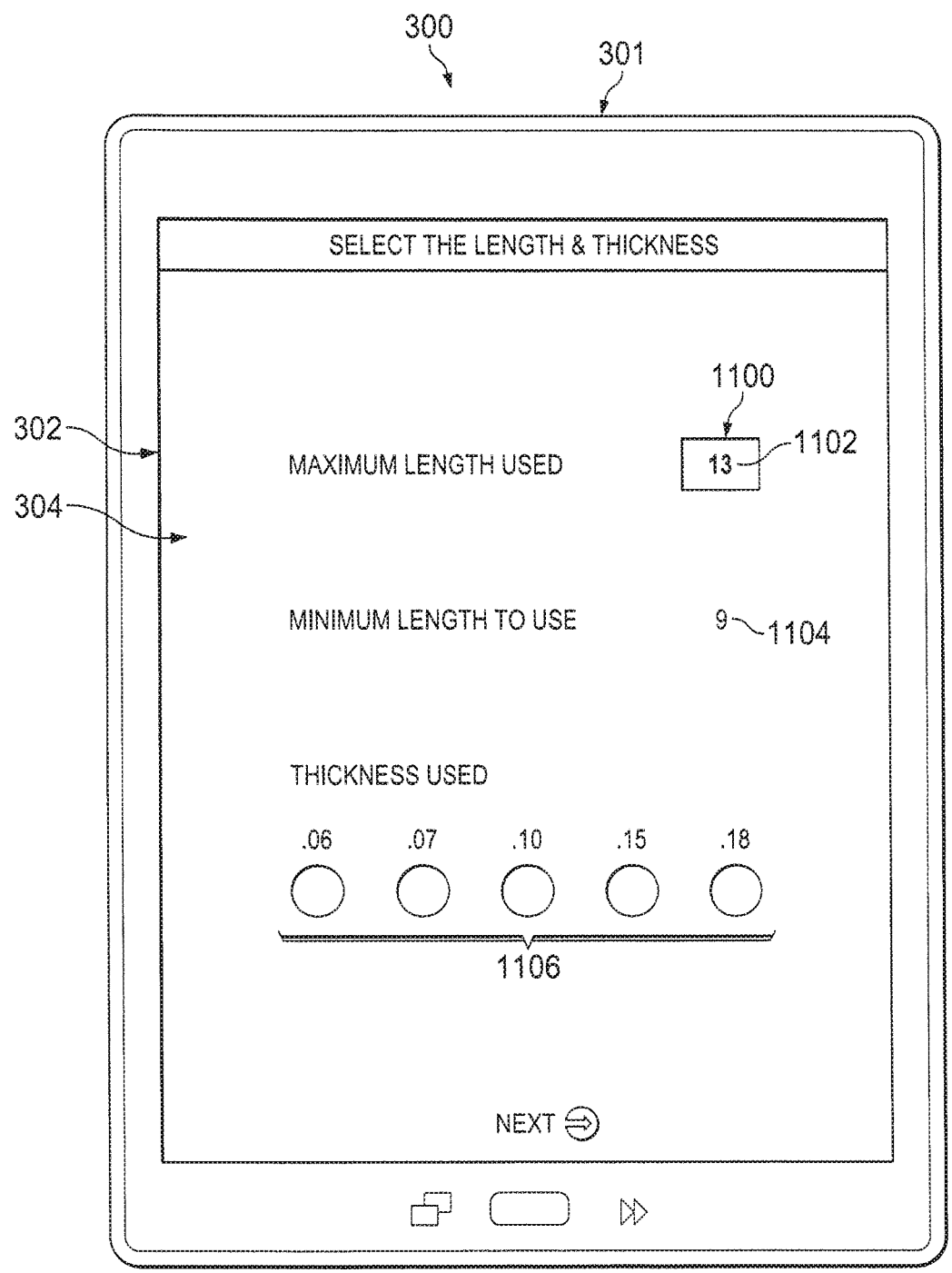
FIG. 11 is an illustration of options for lash lengths and lash thicknesses displayed in the graphical user interface, in accordance with an embodiment.

FIG. 11 is an illustration of options for lash lengths and lash thicknesses displayed in the graphical user interface 304. An input field 1100 is displayed in the graphical user interface 304 to allow user input to define a maximum lash length 1102. When user input has been entered defining the maximum lash length 1102, a minimum lash length 1104 is determined based on the maximum lash length 1102. In one embodiment, the minimum lash length 1104 is computed as the maximum lash length 1102 minus 4 millimeters. Thickness controls 1106 are graphical controls displayed in the graphical user interface 304 to allow for user input to select the thickness for the lashes. Although these graphical controls are depicted as radio buttons, other types of graphical controls may be used.

FIG. 12 is an illustration of a custom code structure. The custom code structure 1200 may be an example of one type of structure for the custom code 214 described in FIG. 2. The custom code structure 1200 may include at least one of a profile element 1202, a fullness element 1204, a curl element 1206, a lash type element 1208, a lash length element 1210, a lash thickness element 1212, or an application method element 1214. The values assigned to these different elements of the custom code structure 1200 may be assigned based on selections made via user input.

As depicted, the profile element 1202 may be assigned a value selected from one of "S," "D," and "U," which correspond to a straight profile, a downward profile, and an upward profile, respectively. The fullness element 1204 may be assigned a value selected from one of "B," "D," and "E," which correspond to a basic level of fullness, a dramatic level of fullness, and an extreme level of fullness, respectively. The curl element 1206 may be assigned a value selected from one of "C," "D," and "L+," which correspond to a soft curl, a tight curl, and a combination curl, respectively. The lash type element 1208 may be assigned a value selected from one of "S" and "M," which correspond to a silk type and a mink type, respectively.

Further, the lash length element 1210 may be assigned a value between 6 millimeters and 15 millimeters. In some cases, the lash length element 1210 may be assigned a value between 9 millimeters and 15 millimeters. The value for the lash length element 1210 corresponds to a maximum lash length, which is the length of the lash that will be placed at an identified point of emphasis. The lash thickness element 1212 may be assigned a value selected from one of 0.06 millimeters, 0.07 millimeters, 0.10 millimeters, 0.15 millimeters, and 0.18 millimeters. The application method element 1214 may be assigned a value selected from one of "C" and "MV," which correspond to a classic application method and a multi-volume application method, respectively.

The values for the various elements described above are only examples of the different types of values that may be assigned to these elements. Further, the different elements described above for the custom code structure 1200 are only examples of the different types of elements that may be included. In some embodiments, the custom code structure 1200 may have other types of elements in place of or in addition to the ones described above. In other embodiments, the elements described above may be arranged in a different manner.

In one or more embodiments, at least a portion of the values for the various elements of the custom code structure 1200 may be assigned by the lash design system 300. For example, the value for the profile element 1202 may be assigned by the lash design system 300, without any user input, based on the image 306 described in FIG. 3.

Figure 13:
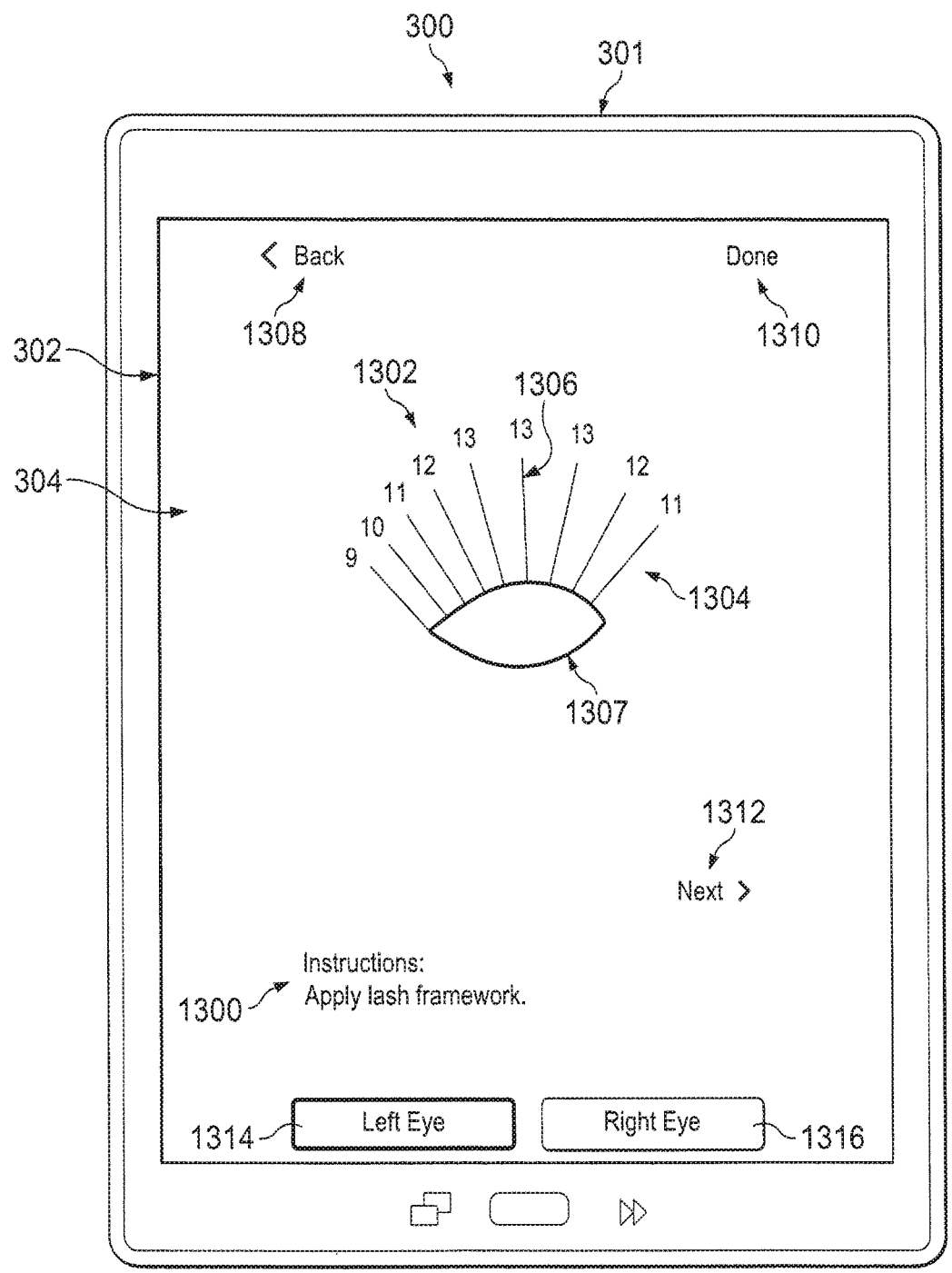
FIG. 13 is an illustration of instructions for a first pass in the physical application of a set of lashes for a left eye, in accordance with an embodiment.

FIGS. 13-21 are illustrations of a series of instructions for the physical application of a set of lashes based on a custom lash design (e.g., custom lash design 130) displayed in the graphical user interface 304 in accordance with an example embodiment. FIG. 13 is an illustration of instructions for a first pass in the physical application of a set of lashes to the natural eyelashes for a left eye. The instructions 1300 for the first pass are displayed in the graphical user interface 304.

The instructions 1300 indicate that the first pass of lashes to be applied will be to form the lash framework 1302. The lash framework 1302 includes framing lashes 1304 and frames 1306 between the framing lashes 1304. In this example embodiment, the framing lashes 1304 include 9 lashes that define 8 frames (e.g., the space between the framing lashes). In some embodiments, the framing lashes 1304 may be substantially equally spaced such that the frames 1306 have substantially equal widths.

The framing lashes 1304 indicate the longest lashes that are allowed at the different locations along the eye, which is represented by outline 1307. Applying these framing lashes 1304 in a first pass makes it easier to apply the remaining lashes. The remaining lashes, which may be referred to as filler lashes, are applied within the frames 1306 between the framing lashes 1304. In one or more embodiments, each pass of lash application is performed beginning at or near the inner corner of the eye and in a direction moving towards the outer corner of the eye.

A back control 1308 allows a user to go back to a previous display or previous step. A done control 1310 allows a user to indicate that the application is completed or that use of the instructions 1300 has been completed. A next step control 1312 allows a user to receive instructions for the next step. Left eye indicator 1314 and right eye indicator 1316 are displayed, with the left eye indicator 1314 being visually presented as being selected. This selection informs the user that the instructions 1300 are specific to the left eye.

Figure 14:
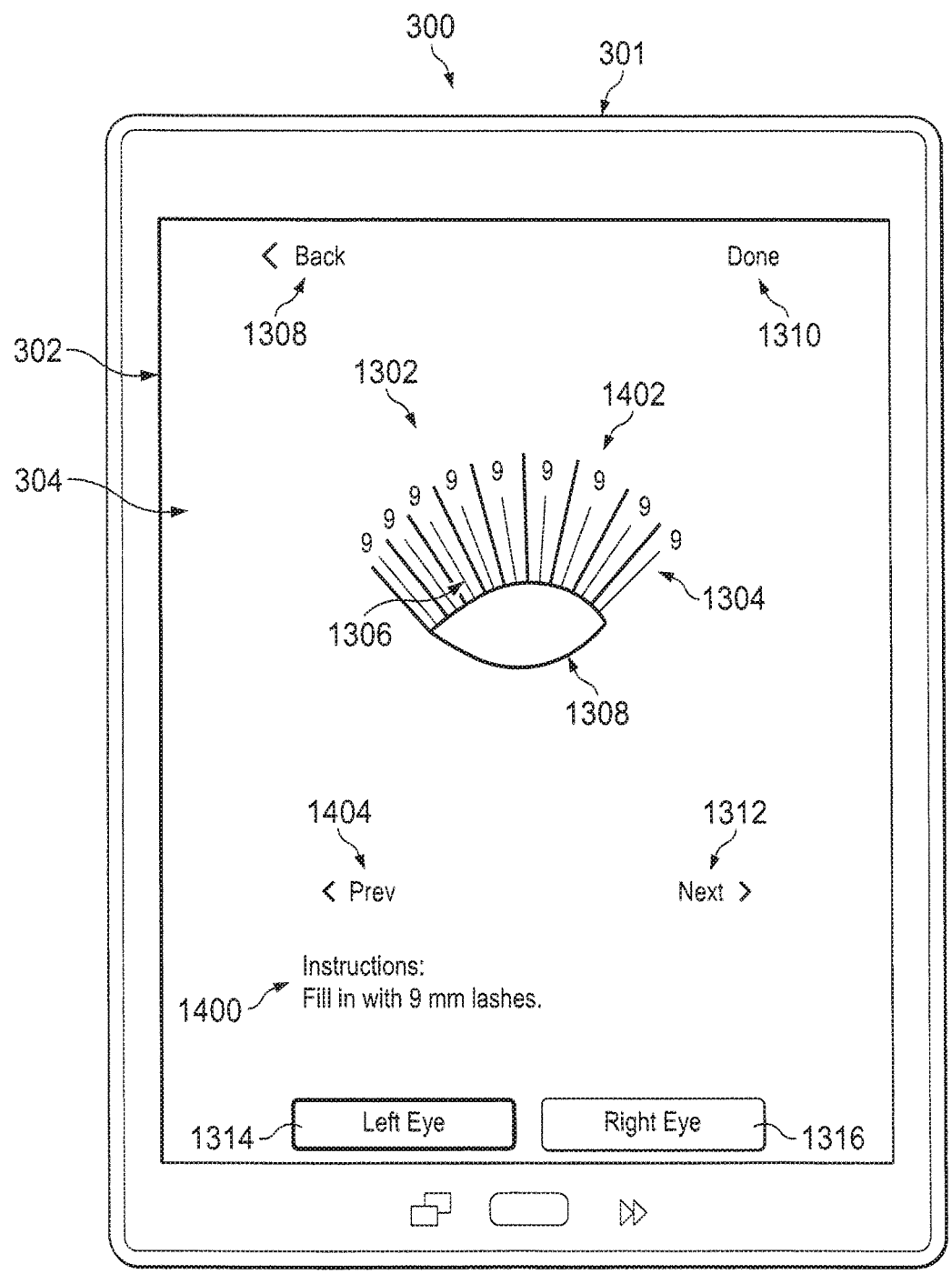
FIG. 14 is an illustration of instructions for a second pass in the physical application of the set of lashes, in accordance with an embodiment.

FIG. 14 is an illustration of instructions for a second pass in the physical application of the set of lashes to the natural lashes of the left eye. The instructions 1400 displayed indicate that the second pass of lashes 1402 requires that a filler lash of the shortest length (e.g., 9 millimeters) be applied within each of the frames 1306. The shortest length is the shortest length as identified by the lash framework 1302 displayed in the graphical user interface 304 in FIG. 13. The framing lashes 1304 are visually presented in a manner that is distinguishable from the filler lashes of the second pass of lashes 1402. For example, the framing lashes may be depicted in a different color, with a different thickness, or as a dotted line. A previous step control 1404 allows a user to return to a previous step when needed.

Figure 15:
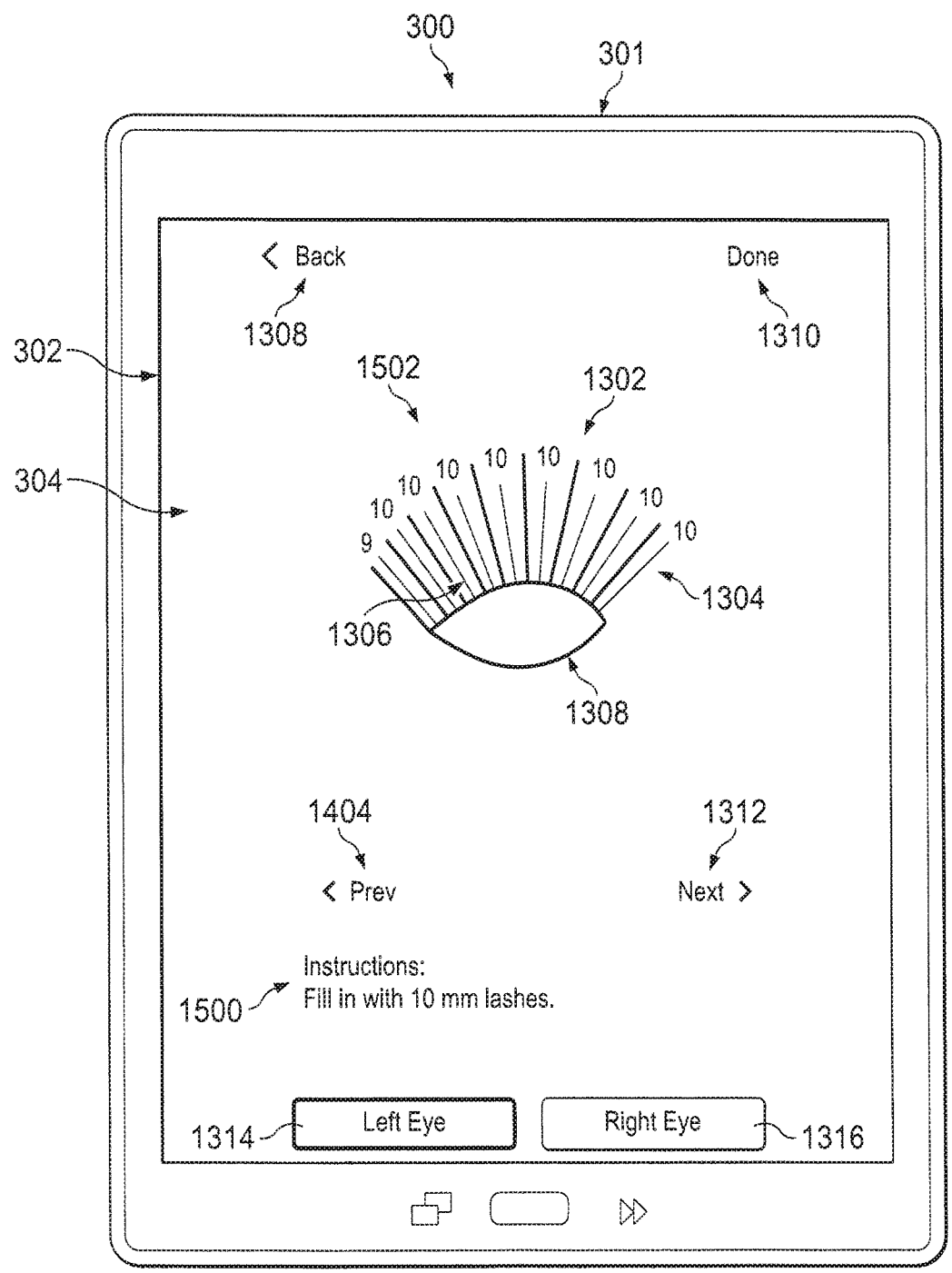
FIG. 15 is an illustration of instructions for a third pass in the physical application of the set of lashes, in accordance with an embodiment.

FIG. 15 is an illustration of instructions for a third pass in the physical application of the set of lashes to the natural lashes of the left eye. The instructions 1500 displayed indicate that the third pass of lashes 1502 requires texturing with the second shortest length (e.g., 10 millimeters) within the frames 1306. With any given pass, the length of a filler lash applied within a particular frame may not exceed the length of the framing lash on the side towards the inside of the eye. Thus, texturing with the second shortest length means that filler lashes of the second shortest length are applied within all of the frames 1306 except for the innermost frame.

Figure 16:
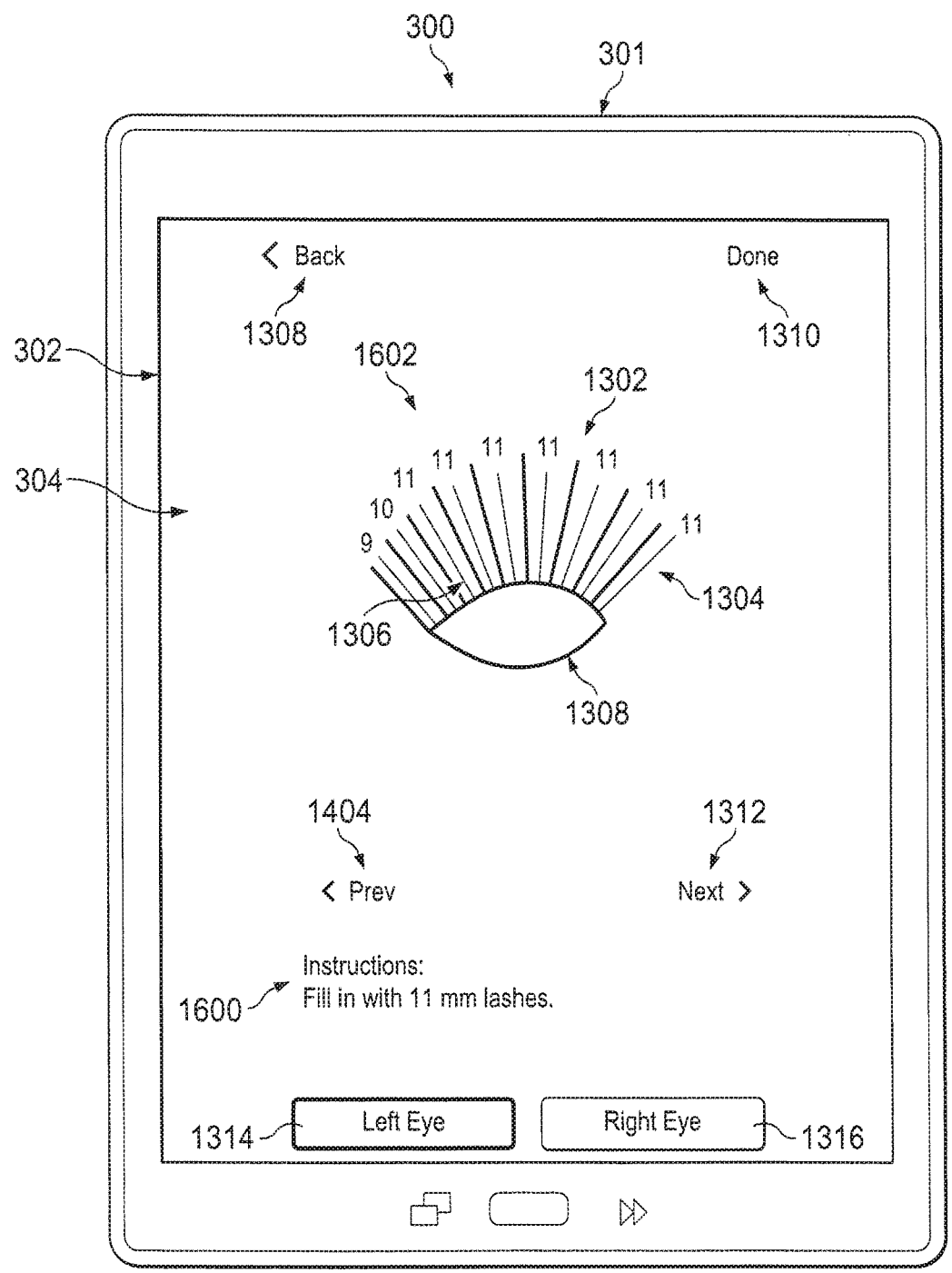
FIG. 16 is an illustration of instructions for a fourth pass in the physical application of the set of lashes, in accordance with an embodiment.

FIG. 16 is an illustration of instructions for a fourth pass in the physical application of the set of lashes to the natural lashes of the left eye. The instructions 1600 displayed indicate that the fourth pass of lashes 1602 requires texturing with the third shortest length (e.g., 11 millimeters) be applied within each of the frames 1306. As before, the length of a filler lash applied within a particular frame may not exceed the length of the framing lash just towards the inside of the eye. Thus, texturing with the third shortest length, which is also the third longest length, means that filler lashes of the third shortest length are applied within all of the frames 1306 except for two most inner frames.

Figure 17:
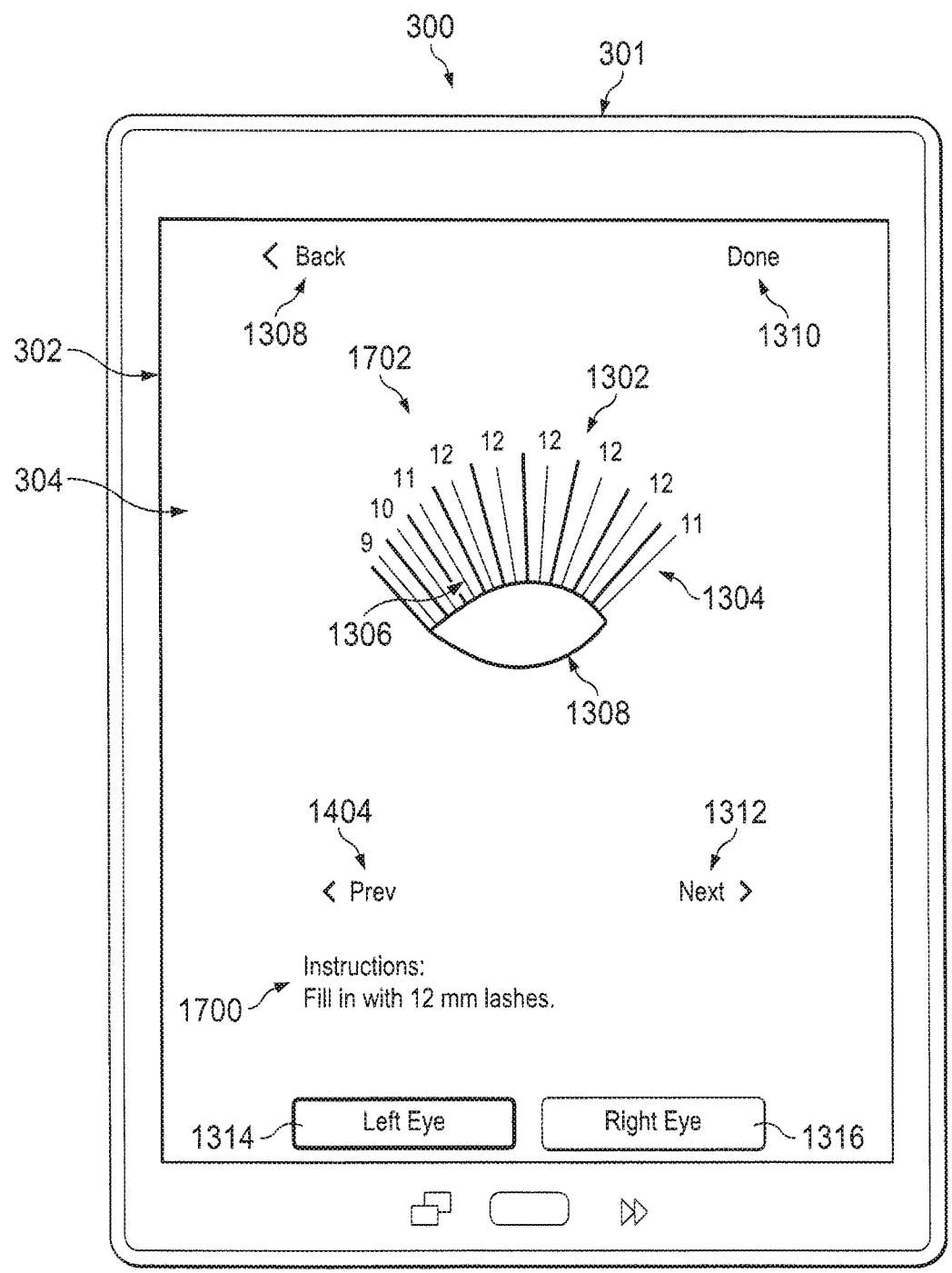
FIG. 17 is an illustration of instructions for a fifth pass in the physical application of the set of lashes, in accordance with an embodiment.

FIG. 17 is an illustration of instructions for a fifth pass in the physical application of the set of lashes to the natural lashes of the left eye. The instructions 1700 displayed indicate that the fifth pass of lashes 1702 requires texturing with the second longest length (e.g., 12 millimeters).

Figure 18:
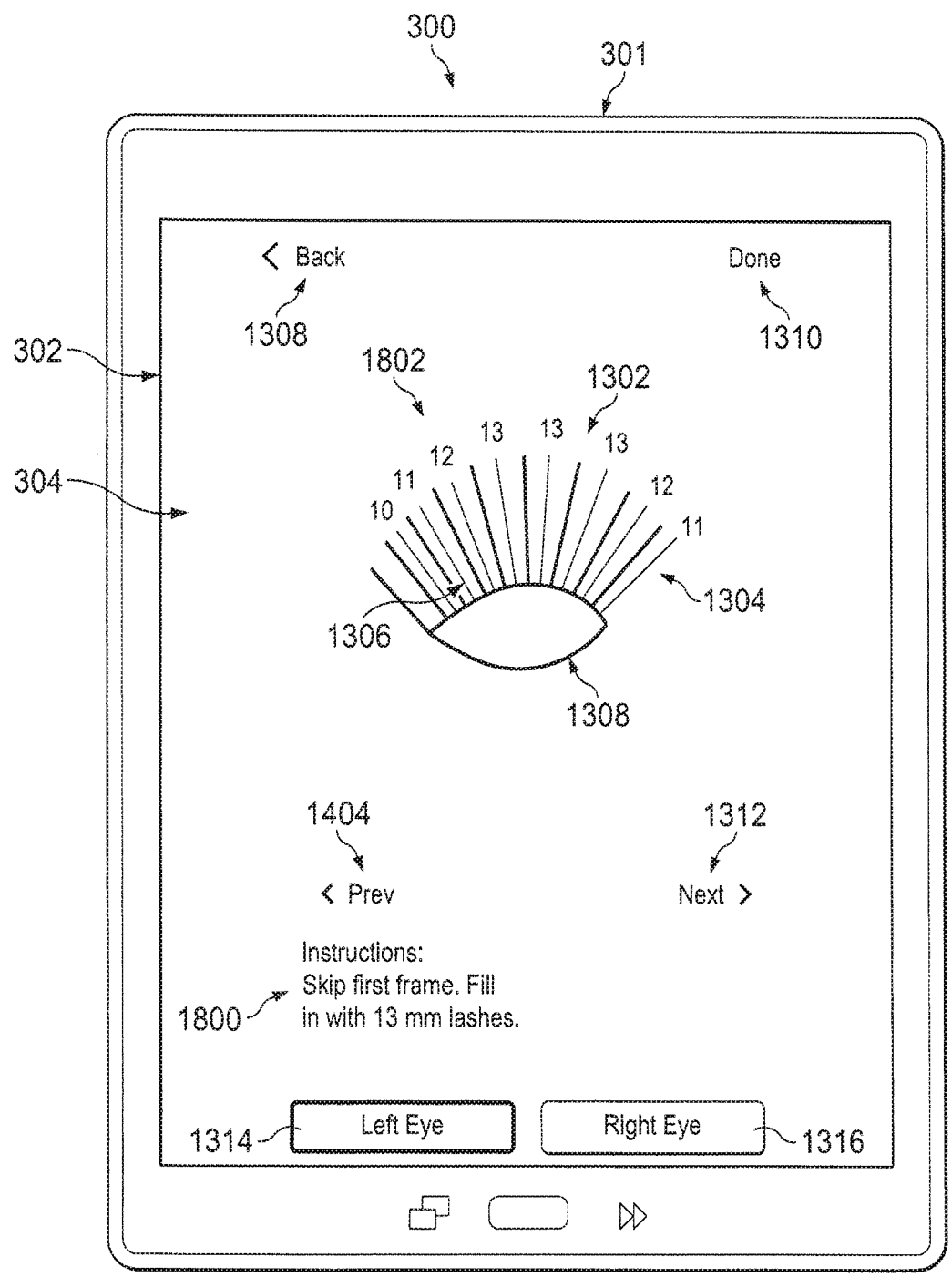
FIG. 18 is an illustration of instructions for a sixth pass in the physical application of the set of lashes, in accordance with an embodiment.

FIG. 18 is an illustration of instructions for a sixth pass in the physical application of the set of lashes to the natural lashes of the left eye. The instructions 1800 displayed indicate that the sixth pass of lashes 1802 requires texturing with the longest length (e.g., 13 millimeters). In this example embodiment, the instructions 1700 make clear that the first frame (the most inner frame) of the frames 1306 is to be skipped.

Figure 19:
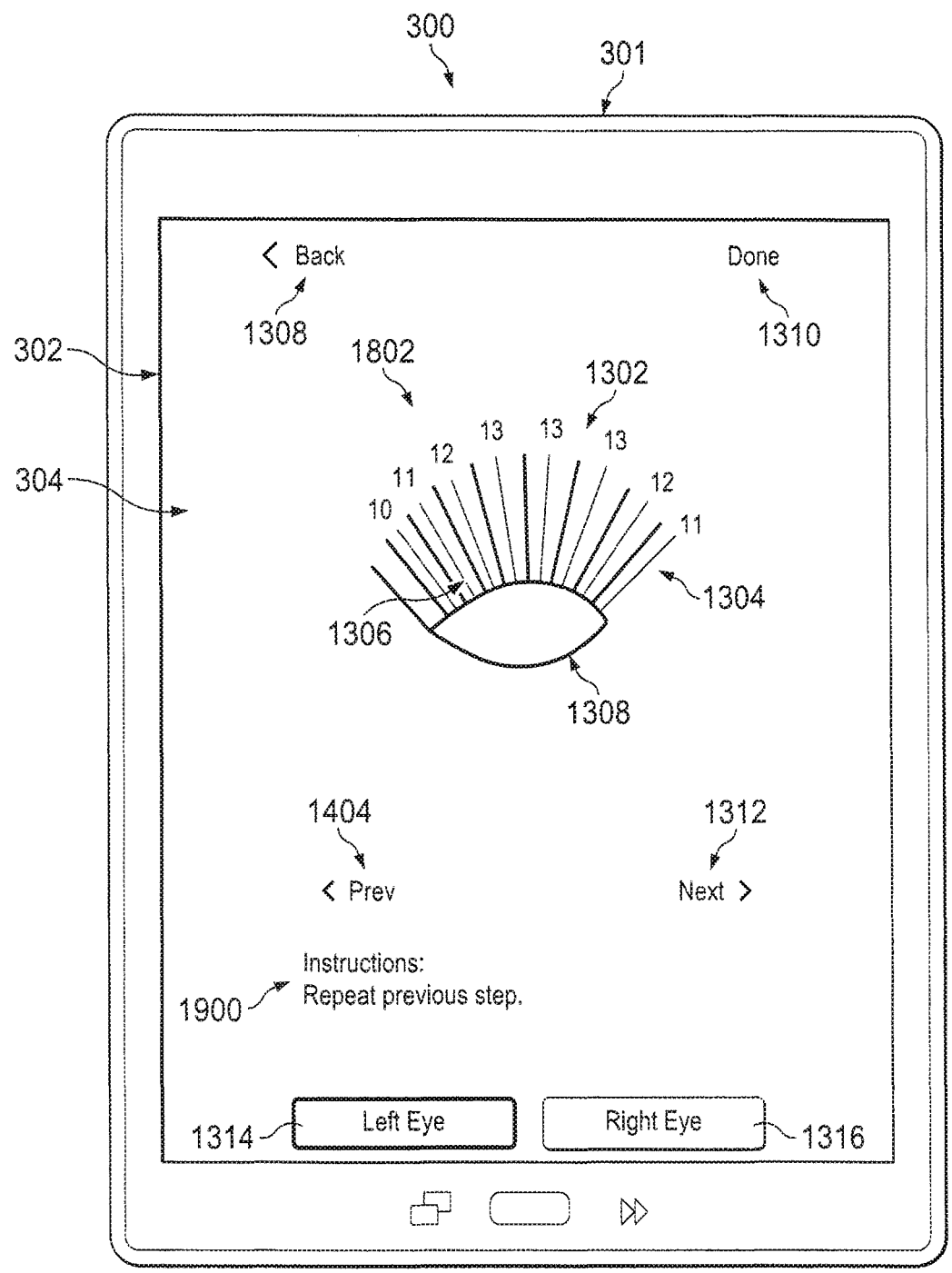
FIG. 19 is an illustration of instructions for final passes in the physical application of the set of lashes, in accordance with an embodiment.
Figure 20:
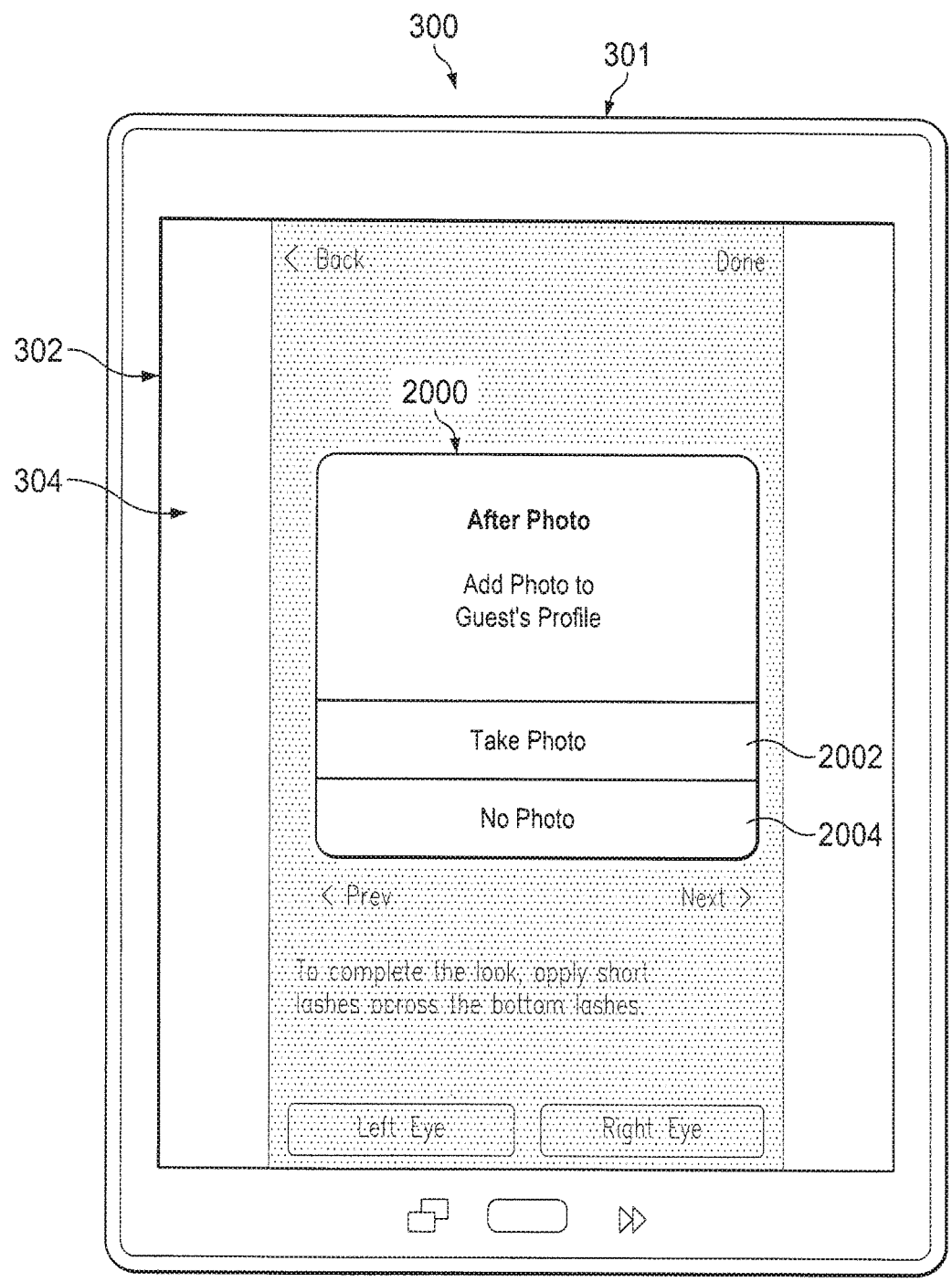
FIG. 20 is an illustration of an option for taking an after-application picture displayed in the graphical user interface, in accordance with an embodiment.

FIG. 19 is an illustration of instructions for final passes in the physical application of the set of lashes. The instructions 1900 displayed indicate that the previous pass, the sixth pass of lashes 1802, should be repeated a selected number of times. In one example, the greater the number of times that this pass of filler lashes is repeated, the greater the fullness of the lashes. For example, if 9 total passes of filler lashes are applied after the initial framing lashes have been applied, then 9 filler lashes are applied with respect to nearly all of the frames 1306. These instructions 1900 complete the instructions for the physical application of the set of lashes for the left eye. A similar series of instructions may then be displayed in a similar stepwise manner to guide the physical application of a set of lashes for the right eye, FIG. 20 is an illustration of an option for taking an after-application picture displayed in the graphical user interface 304. Prompt 2000 may be displayed one the last pass for the last eye has been completed. Prompt 2000 provides the user with the first option 2002 of taking a photograph or the second option 2004 of not taking a photograph. In one or more embodiments, when the first option 2002 is selected and a photograph taken, this picture may be stored by the lash design system 300.

Figure 21:
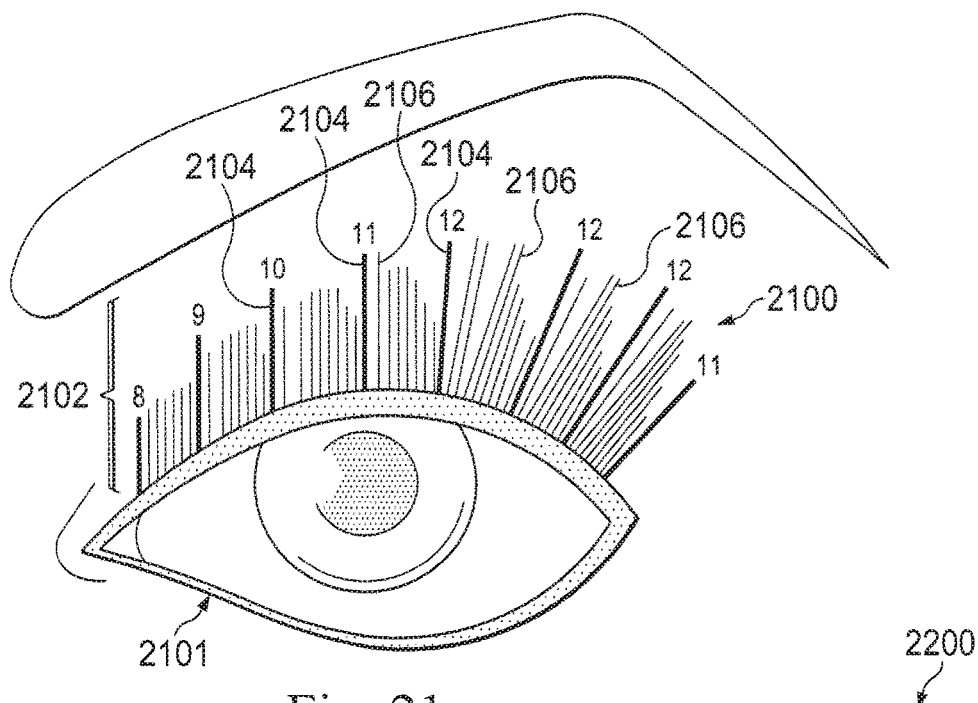
FIG. 21 is an illustration of a final custom lash design, in accordance with an embodiment.

FIG. 21 is an illustration of a final custom lash design in accordance with an embodiment. This custom lash design 2100 is an example of one implementation for the custom lash design 130 described in FIG. 1. The custom lash design 2100 is illustrated relative to an eye 2101. In some embodiments, the custom lash design 2100 may be displayed in relation to the eye 2101 in a graphical user interface (e.g., graphical user interface 112). The custom lash design 2100 includes a lash framework 2102. The lash framework 2102 includes framing lashes 2104. The final custom lash design 2100 also includes filler lashes 2106 that are positioned within the spaces between the framing lashes 2104.

Figure 22:
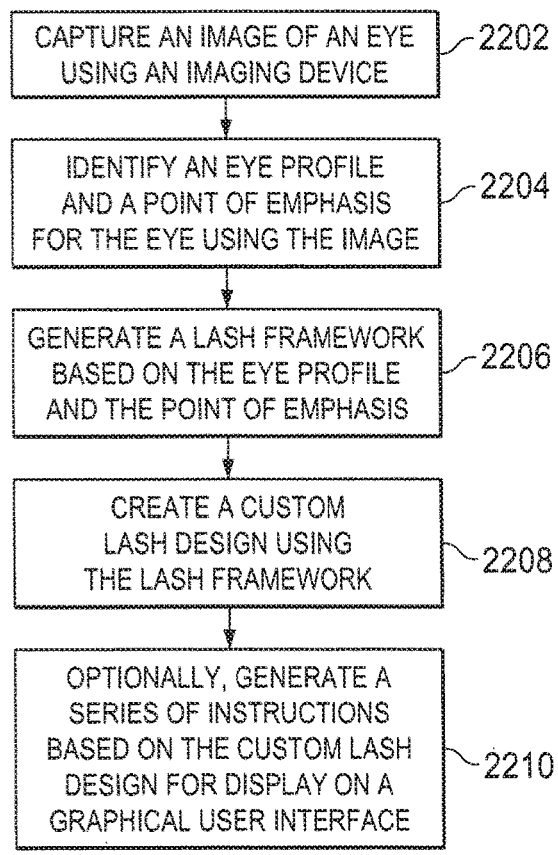
FIG. 22 is a flowchart illustrating a method for improving lash application, in accordance with an embodiment.

FIG. 22 is a flowchart illustrating a method 2200 for improving lash application. The method 2200 is illustrated as a set of operations or processes 2202 through 2210 and is described with continuing reference to FIGS. 1 and 2. Not all of the illustrated processes 2202 through 2210 may be performed in all embodiments of method 2200. Additionally, one or more processes that are not expressly illustrated in FIG. 22 may be included before, after, in between, or as part of the processes 2202 through 2210. In some embodiments, one or more of the processes 2202 through 2210 may be implemented, at least in part, in the form of executable code stored on non-transitory, tangible, machine-readable media that when run by one or more processors (e.g., the processor 102 in FIG. 1) may cause the one or more processors to perform one or more of the processes. In one or more embodiments, the processes 2202 through 2210 may be performed by the lash design system 100.

Optionally, at process 2202, an image 118 of an eye is captured using an imaging device 104. In some embodiments, the imaging device 104 may be associated with a mobile device 114. In alternative embodiments, the image may be received from another source such as a different mobile device or a remote camera. At process 2204, an eye profile 230 and a point of emphasis 232 are identified for the eye using the image 118. The eye profile 230 may be, for example, selected from one of a straight profile, a downward profile, an upward profile, or some other type of eye profile. In other embodiments, the image used to identify the eye profile 230 and the point of emphasis 232 at process 2204 may be an image received from a remote server, a cloud, or some other source.

At process 2206, a lash framework 216 is generated based on the eye profile 230 and the point of emphasis 232. The lash framework 216 identifies a plurality of framing lashes. The framing lashes define a plurality of frames between the framing lashes. At process 2208, a custom lash design 130 is created using the lash framework 216. The custom lash design 130 may be used to guide the physical application of a set of lashes to the eye. The set of lashes may be, for example, a set of false silk lashes, a set of false mink lashes, or a set of some other type of false lashes.

Optionally, at process 2210, a series of instructions is generated based on the custom lash design 130 for display on a graphical user interface 112. The series of instructions is used to aid in the physical application of the lashes according to the custom lash design 130. The graphical user interface 112 may belong to a display device 106 associated with the mobile device 114. The method 2200 has been described with respect to a single eye. But the method 2200 may be repeated for each eye of a client. In some cases, the custom lash design 130 created for the left eye of a client may be different from the custom lash design 130 created for the right eye of a client due to natural differences between these two eyes.

Although the method 2200 has been described as being implemented using the mobile device 114, in other example embodiments, the method 2200 may be implemented manually by a human operator (e.g., service member, lash technician, etc.). The human operator may use the image 118 generated by the imaging device 104, which may be part of or separate from the mobile device 114, or may use a different image of the eye to identify the eye profile 230 and the point of emphasis 232. In some cases, when the method 2200 is performed manually, the human operator may identify the eye profile 230 and the point of emphasis 232 at process 2204 based on the human operator's own visual perception of the eye of a client.

Figure 23:
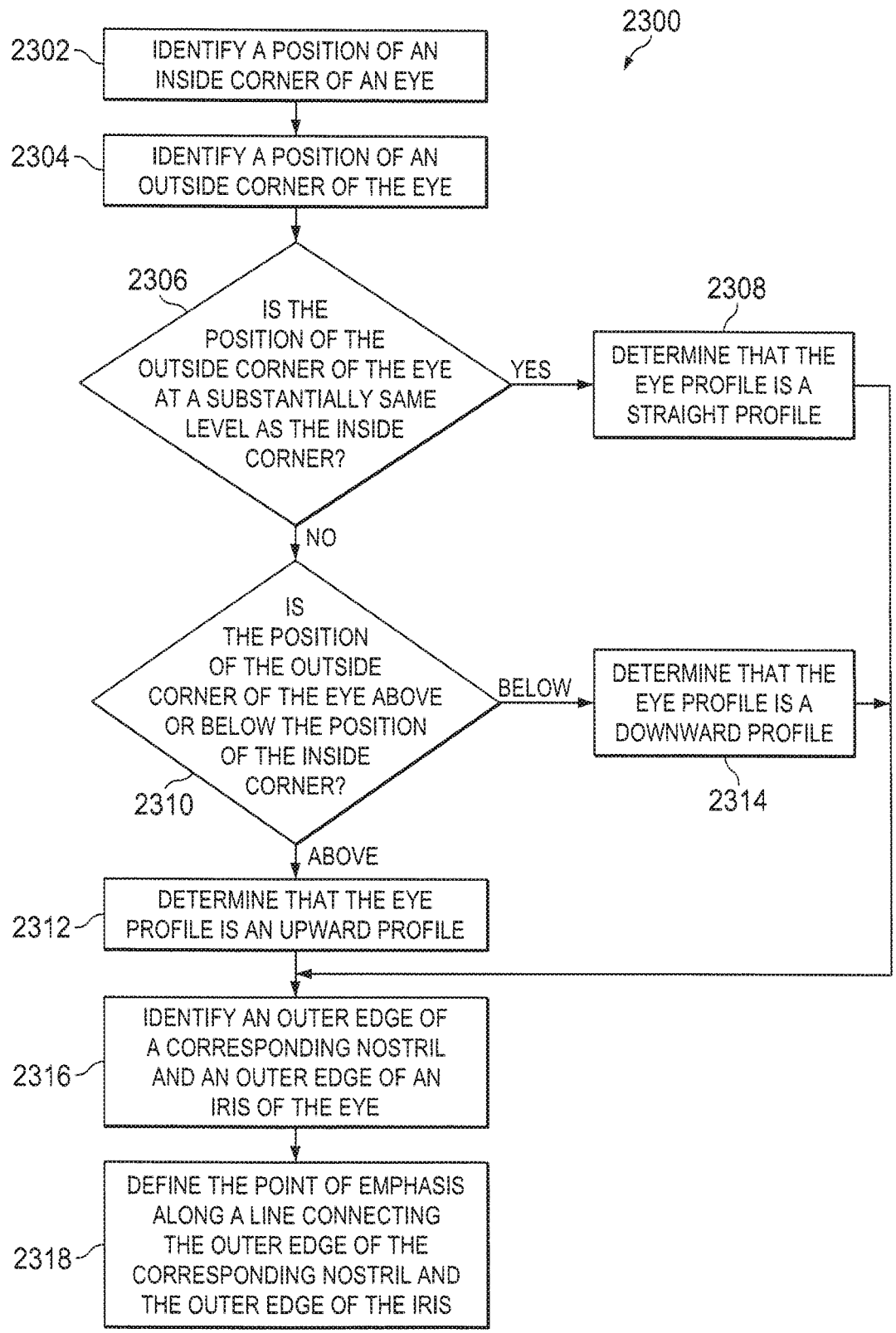
FIG. 23 is a flowchart illustrating a method for identifying an eye profile and a point of emphasis, in accordance with an embodiment.

FIG. 23 is a flowchart illustrating a method 2300 for identifying an eye profile and a point of emphasis. The method 2300 is illustrated as a set of operations or processes 2302 through 2318 and is described with continuing reference to FIGS. 1 and 2. Not all of the illustrated processes 2302 through 2318 may be performed in all embodiments of method 2300. Additionally, one or more processes that are not expressly illustrated in FIG. 23 may be included before, after, in between, or as part of the processes 2302 through 2318. In some embodiments, one or more of the processes 2302 through 2308 may be implemented, at least in part, in the form of executable code stored on non-transitory, tangible, machine-readable media that when run by one or more processors (e.g., the processor 102 in FIG. 1) may cause the one or more processors to perform one or more of the processes.

The method 2300 may be an example of one manner in which the eye profile 230 and the point of emphasis 232 are identified at process 2204 in FIG. 22. In one or more embodiments, the processes 2302 through 2318 may be performed by the lash design system 100. Specifically, in some embodiments, one or more of the processes 2302 through 2318 may be performed using the mobile device 114. In other example embodiments, one or more of the processes 2302 through 2318 may be performed manually by a human operator.

At process 2302, a position of an inside corner of the eye is detected. At process 2304, a position of an outside corner of the eye is detected. In some embodiments, the position of the outside corner is identified relative to the position of the inside corner.

At process 2306, a determination is made as to whether the position of the outside corner of the eye is at a substantially same level as the inside corner. If the position of the outside corner of the eye is at substantially the same level as the inside corner, then, at process 2308, the eye profile 230 is determined to be a straight profile, with the method 2300 proceeding to process 2316 described further below. Otherwise, at process 2310, a determination is made as to whether the position of the outside corner of the eye is above or below the position of the inside corner. If the position of the outside corner of the eye is above the position of the inside corner, then, at process 2312, the eye profile 230 is determined to be an upward profile, with the method 2300 proceeding to process 2316 described further below. Otherwise, if the position of the outside corner of the eye is below the position of the inside corner, then, at process 2314, the eye profile 230 is determined to be a downward profile, with the method 2300 proceeding to process 2316 described below.

At process 2316, an outer edge of a corresponding nostril and an outer edge of an iris of the eye are identified. The corresponding nostril may be the nostril on the same side of the face. For example, for a left eye, the left nostril is the corresponding nostril and for a right eye, the right nostril is the corresponding nostril. At process 2318, the point of emphasis 232 is defined along a line connecting the outer edge of the corresponding nostril and the outer edge of the iris.

Figure 24:
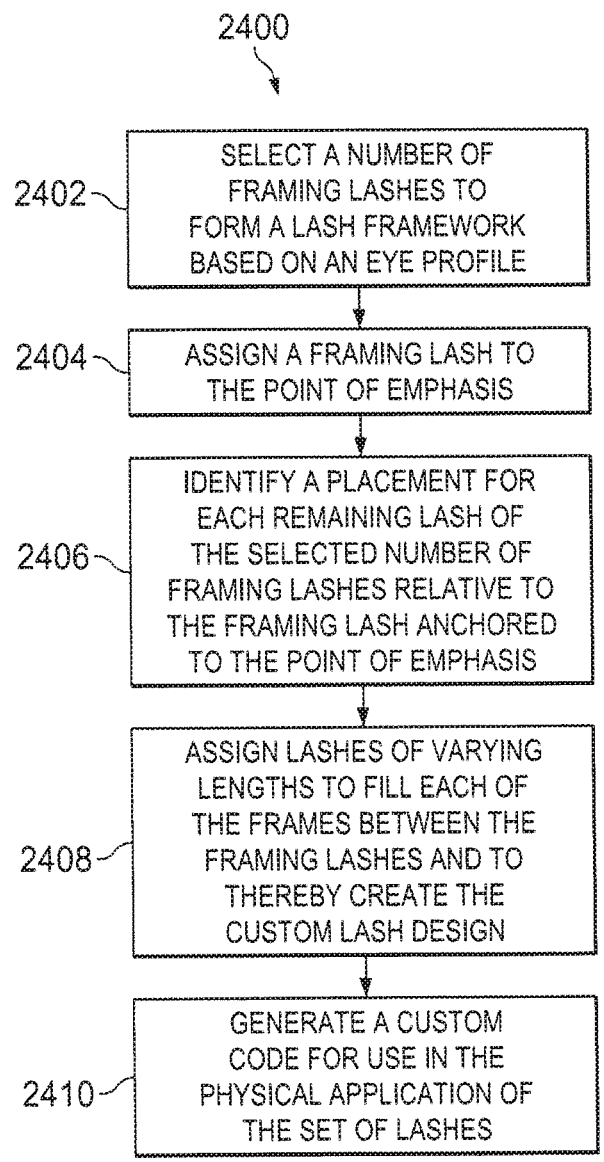
FIG. 24 is a flowchart illustrating a method for generating a lash framework and creating a custom lash design based on the lash framework, in accordance with an embodiment.

FIG. 24 is a flowchart illustrating a method 2400 for generating a lash framework and creating a custom lash design based on the lash framework. The method 2400 is illustrated as a set of operations or processes 2402 through 2410 and is described with continuing reference to FIGS. 1 and 2. Not all of the illustrated processes 2402 through 2410 may be performed in all embodiments of method 2400. Additionally, one or more processes that are not expressly illustrated in FIG. 24 may be included before, after, in between, or as part of the processes 2402 through 2410. In some embodiments, one or more of the processes 2402 through 2410 may be implemented, at least in part, in the form of executable code stored on non-transitory, tangible, machine-readable media that when run by one or more processors (e.g., the processor 102 in FIG. 1) may cause the one or more processors to perform one or more of the processes.

Further, the method 2400 may be used to implement the processes 2206 and 2208 described in FIG. 22. In one or more embodiments, the processes 2402 through 2410 may be performed by the lash design system 100. Specifically, in some embodiments, one or more of the processes 2402 through 2410 may be performed using the mobile device 114. In other example embodiments, one or more of the processes 2402 through 2410 may be performed manually by a human operator.

At process 2402, a number of framing lashes is selected to form the lash framework 216 based on the eye profile 230. For example, when the eye profile 230 is a straight profile or an upward profile, 8 framing lashes may be used for the lash framework 216. When the eye profile 230 is a downward profile, 9 framing lashes may be used for the lash framework 216. Of course, in other embodiments, some other number of lashes may be selected for one or more of the straight, upward, and downward profiles. In some embodiments, selecting the number of framing lashes at process 2402 also includes selecting the spread, or arrangement, of lash lengths for these framing lashes.

At process 2404, a framing lash is assigned to the point of emphasis 232. In particular, this framing lash may be selected for placement at the point of emphasis 232 for the eye. This framing lash may also be referred to as an anchor lash, an emphasis lash, or a point of emphasis lash. This anchor lash has a maximum lash length, which may be user-selected. For example, either the technician or the client may select this maximum lash length. In some cases, this maximum lash length may be predetermined based on the eye profile 230 but may be later customizable based on, for example, the user input 110.

At process 2406, a placement for each remaining framing lash of the selected number of framing lashes is identified relative to the framing lash anchored to the point of emphasis 232. The placement for each remaining framing lash relative to the eye lid is based on the eye profile 230. For example, for a straight profile, the longest lashes of the remaining lashes may be centered around the anchor lash. For a downward profile, the longest lashes may stop at the anchor lash. In other words, no lashes as long as the anchor lash may be selected for placement between the point of emphasis 232 and the outer corner of the eye. For an upward profile, the longest lashes may begin at the anchor lash. In other words, the anchor lash may be the first of one or more equally long lashes between the point of emphasis 232 and the outer corner of the eye.

A plurality of frames is defined between each adjacent pair of framing lashes. For example, with 9 framing lashes, there may be 8 frames to help guide lash application. Each frame may be defined between a corresponding inner framing lash and a corresponding outer framing lash that have no other framing lashes between them. In one or more embodiments, the placement of the framing lashes may be selected such that the frames are substantially evenly spaced.

At process 2408, lashes of varying lengths are assigned to fill each of the frames between the framing lashes and to thereby create the custom lash design. These lashes are referred to as filler lashes. The process of filling the lashes within the frames may be referred to as "texturing" or "texturizing." In one or more embodiments, the longest lash allowed within each frame is limited to the length of the corresponding inner framing lash that defines that frame. In other embodiments, the longest lash allowed within each frame is limited to the length of the corresponding outer framing lash that defines that frame. Thus, a given frame may be filled or textured with lashes having varying lengths.

Any number of lashes may be used to fill each frame. For example, each frame may be filled with between 5 to 15 lashes, depending on the level of fullness selected. Thus, the overall number of lashes used to create the custom lash design 130 may be based on the level of fullness selected. In some example embodiments, each of the frames is filled with the same number of filler lashes. In other example embodiments, one or more of the frames may be filled with a different number of filler lashes as compared to the other frames. For example, an innermost frame (e.g., the frame closest to the innermost portion of the eye) may have 1 or 2 fewer filler lashes than the other frames.

At process 2410, a custom code 214 is generated for use in the physical application of the set of lashes. The custom code 214 may be generated at any point during the method 2400. In some embodiments, the custom code 214 is generated in one or more steps throughout the method 2400. The custom code 214 identifies at least one of a selected level of fullness 218, a selected level of curl 220, a selected lash type 222, a selected lash length 224, a selected lash thickness 226, or a selected application method 228 for the set of lashes to be applied. These selections may be based on the user input 110. In one or more embodiments, the custom code 214 has a structure similar to the custom code structure 1200 described in FIG. 12.

Figure 25:
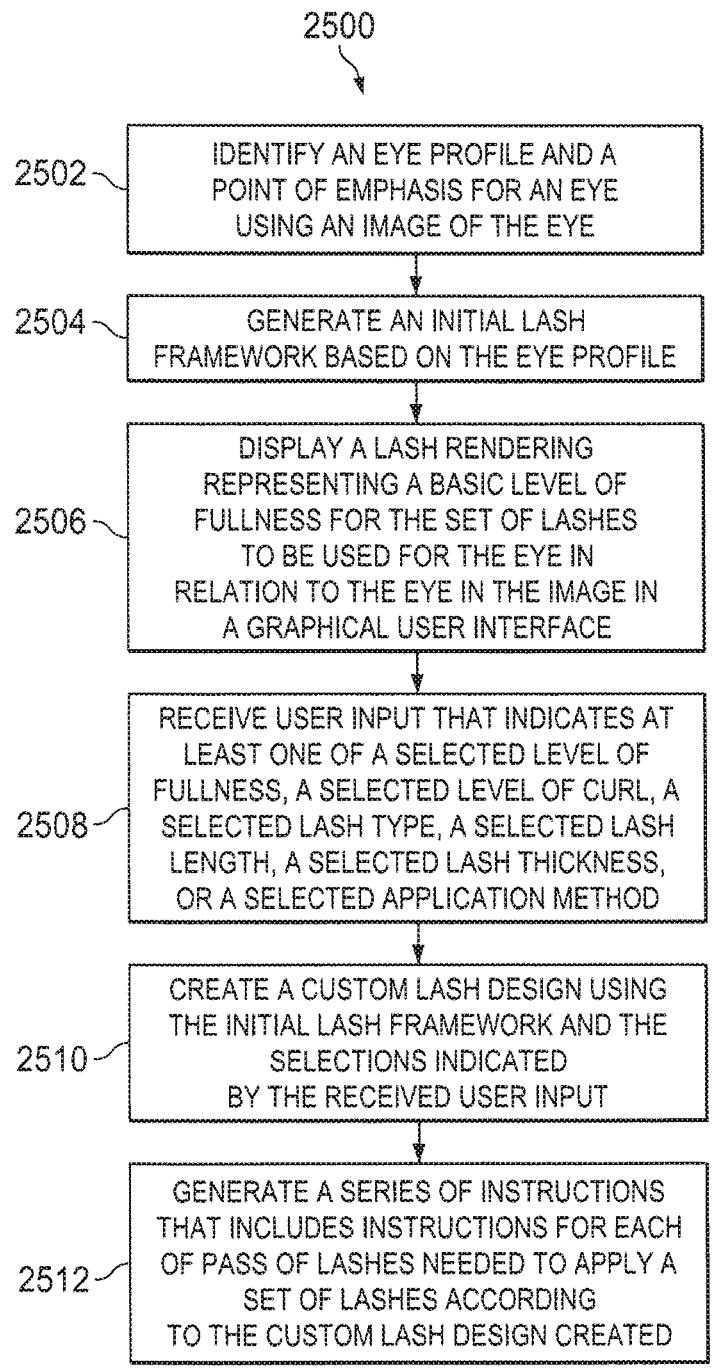
FIG. 25 is a flowchart illustrating a method for creating a custom lash design, in accordance with an embodiment.

FIG. 25 is a flowchart illustrating a method 2500 for creating a custom lash design. The method 2500 is illustrated as a set of operations or processes 2502 through 2512 and is described with continuing reference to FIGS. 1 and 2. Not all of the illustrated processes 2502 through 2512 may be performed in all embodiments of method 2500. Additionally, one or more processes that are not expressly illustrated in FIG. 25 may be included before, after, in between, or as part of the processes 2502 through 2512. In some embodiments, one or more of the processes 2502 through 2512 may be implemented, at least in part, in the form of executable code stored on non-transitory, tangible, machine-readable media that when run by one or more processors (e.g., the processor 102 in FIG. 1) may cause the one or more processors to perform one or more of the processes. In one or more embodiments, the processes 2502 through 2512 may be performed by the lash design system 100.

At process 2502, an eye profile 230 and a point of emphasis 232 are identified for an eye using an image of an eye. At process 2504, an initial lash framework is generated based on the eye profile 230. At process 2506, a lash rendering representing a basic level of fullness for the set of lashes to be used for the eye is displayed in relation to the eye in the image in a graphical user interface 112. The basic level of fullness may be a default level of fullness. In one or more embodiments, the display of this lash rendering is displayed with one or more graphical controls or prompts for use in obtaining user input 110 regarding the level of fullness.

At process 2508, user input 110 is received that indicates at least one of a selected level of fullness 218, a selected level of curl 220, a selected lash type 222, a selected lash length 224, a selected lash thickness 226, or a selected application method 228. At process 2510, a custom lash design 130 is created using the initial lash framework and the selections indicated by the received user input.

At process 2512, a series of instructions is generated that includes instructions for each pass of lashes needed to apply a set of lashes according to the custom lash design 130 created. The number of passes needed may be determined based on the eye profile 230, the selected level of fullness 218, the selected application method 228, or a combination thereof. The passes needed to create the custom lash design 130 include an "initial pass" of lashes, which refers to the application of the entire set of framing lashes, and one or more "filler passes." Each "filler pass" of lashes includes the application of a single lash within each frame of a selected portion of the frames. The selected portion may include one, some, or all of the frames. For example, one pass of lashes (e.g., filler pass) may include applying a single lash within each of the frames. As another example, another pass of lashes may include applying a single lash within each frame except for the innermost frame. The lashes applied during any given pass may all have the same lengths or different lengths, depending on the custom lash design 130.

One or more elements in embodiments of the invention may be implemented in software to execute on a processor of a computer system such as control processing system. When implemented in software, the elements of the embodiments of the invention are essentially the code segments to perform the necessary tasks. The program or code segments can be stored in a processor readable storage medium or device that may have been downloaded by way of a computer data signal embodied in a carrier wave over a transmission medium or a communication link. The processor readable storage device may include any medium that can store information including an optical medium, semiconductor medium, and magnetic medium. Processor readable storage device examples include an electronic circuit; a semiconductor device, a semiconductor memory device, a read only memory (ROM), a flash memory, an erasable programmable read only memory (EPROM); a floppy diskette, a CD-ROM, an optical disk, a hard disk, or other storage device. The code segments may be downloaded via computer networks such as the Internet, Intranet, etc.

Note that the processes and displays presented may not inherently be related to any particular computer or other apparatus. Various general-purpose systems may be used with programs in accordance with the teachings herein, or it may prove convenient to construct a more specialized apparatus to perform the operations described. The required structure for a variety of these systems will appear as elements in the claims. In addition, the embodiments of the invention are not described with reference to any particular programming language. It will be appreciated that a variety of programming languages may be used to implement the teachings of the invention as described herein.

While certain exemplary embodiments of the invention have been described and shown in the accompanying drawings, it is to be understood that such embodiments are merely illustrative of and not restrictive on the broad invention, and that the embodiments of the invention not be limited to the specific constructions and arrangements shown and described, since various other modifications may occur to those ordinarily skilled in the art.

What is claimed is:

1. A method comprising:
    identifying an eye profile and a point of emphasis for an eye using an image of the eye;
    generating a lash framework based on the eye profile and the point of emphasis, wherein generating the lash framework comprises generating a mapping of a placement for each lash, in a set of lashes, for individual application to a natural lash of the eye based on the eye profile and the point of emphasis for the eye;
    creating a custom lash design using the lash framework, wherein the custom lash design is used for physical application of the set of lashes to the eye;
    displaying the image in a graphical user interface on an electronic display device; and
    displaying a lash rendering corresponding to the custom lash design in relation to the eye in the image in the graphical user interface, wherein the lash rendering is a virtual representation of the set of lashes to be physically applied to the eye.

2. The method of claim 1, further comprising:
    generating a series of instructions based on the custom lash design to aid in the physical application of the set of lashes.

3. The method of claim 2, further comprising:
    displaying the series of instructions on the electronic display device for use in aiding the physical application of the set of lashes.

4. The method of claim 1, wherein generating the lash framework comprises:
    selecting a number of framing lashes to form the lash framework based on the eye profile, wherein the eye profile is selected from one of a straight profile, a downward profile, and an upward profile.

5. The method of claim 1, wherein generating the lash framework comprises:
    anchoring a framing lash of a plurality of framing lashes at the point of emphasis, wherein the framing lash has a maximum lash length; and
    identifying a placement for a remaining portion of the plurality of framing lashes relative to the framing lash, wherein the plurality of framing lashes defines a plurality of frames between the framing lashes.

6. The method of claim 5, wherein creating the custom lash design comprises:
    assigning lashes of varying lengths to fill each frame of the plurality of frames,
        wherein each frame is defined by a corresponding inner framing lash and a corresponding outer framing lash; and
        wherein a longest lash within each frame is limited by a length of the corresponding inner framing lash.

7. The method of claim 1, wherein creating the custom lash design comprises:
generating a custom code for use in the physical application of the set of lashes, wherein the custom code identifies at least one of a level of fullness, a level of curl, a lash type, a lash length, a lash thickness, or an application method for the set of lashes.

8. The method of claim 1, wherein creating the custom lash design comprises:
generating a custom code for use in the physical application of the set of lashes based on user input indicating at least one of a selected level of fullness, a selected level of curl, a selected lash type, a selected lash length, a selected lash thickness, or a selected application method for the set of lashes.

9. The method of claim 1, wherein identifying the eye profile comprises:
identifying a position of an outside corner of the eye relative to an inside corner of the eye; and
determining that the eye profile is a straight profile when the position of the outside corner is at a substantially same level as the inside corner, is a downward profile when the position of the outside corner is below the inside corner, and is an upward profile when the position of the outside corner is above the inside corner.

10. The method of claim 1, wherein identifying the point of emphasis comprises:
identifying an outer edge of a corresponding nostril and an outer edge of an iris of the eye; and
defining the point of emphasis along a line that connects the outer edge of the corresponding nostril and the outer edge of the iris of the eye.

11. The method of claim 1, further comprising:
receiving the image from an imaging device.

12. A method comprising:
identifying an eye profile and a point of emphasis for an eye;
generating a lash framework based on the eye profile and the point of emphasis, wherein generating the lash framework comprises generating a mapping of a placement for each lash, in a set of lashes, for individual application to a natural lash of the eye based on the eye profile and the point of emphasis for the eye;
creating a custom lash design using the lash framework, wherein the custom lash design is used for physical application of the set of lashes to the eye, wherein the set of lashes is a set of false lashes; and
generating a series of instructions for the physical application of the set of lashes to the eye based on the custom lash design.

13. The method of claim 12, further comprising:
displaying the series of instructions on a display device for use in aiding the physical application of the set of false lashes.

14. The method of claim 12, wherein identifying the eye profile and the point of emphasis comprises:
identifying the eye profile and the point of emphasis using an image of the eye, wherein the image is either captured using an imaging device or obtained from a remote server.

15. The method of claim 12, wherein creating the custom lash design comprises:
generating a custom code for use in the physical application of the set of lashes, wherein the custom code identifies at least one of a level of fullness, a level of curl, a lash type, a lash length, a lash thickness, or an application method for the set of lashes.

16. A system comprising:
an imaging device for capturing an image of an eye; and
a processor in communication with the imaging device, the processor being configured to:
identify an eye profile and a point of emphasis for the eye using the image;
generate a lash framework based on the eye profile and the point of emphasis, wherein generating the lash framework comprises generating a mapping of a placement for each lash in a set of lashes, for individual application to a natural lash of the eye based on the eye profile and the point of emphasis for the eye;
create a custom lash design using the lash framework, wherein the custom lash design is used for physical application of the set of lashes to the eye; and
generate a series of instructions for the physical application of the set of lashes based on the custom lash design.

17. The system of claim 16, further comprising:
a display device, wherein a graphical user interface is displayed on the display device and wherein the image is displayed in the graphical user interface.

18. The system of claim 17, wherein the processor is further configured to generate a lash rendering corresponding to the custom lash design for display in relation to the eye in the image in the graphical user interface, and wherein the lash rendering represents the set of lashes to be physically applied to the eye.

19. The system of claim 17, wherein the processor is further configured to display the series of instructions based on the custom lash design on the display device.

20. The system of claim 16, wherein the lash framework includes a plurality of framing lashes that define a plurality of frames between the plurality of framing lashes, and wherein a number of the plurality of framing lashes is selected based on the eye profile.

21. The system of claim 20, wherein the custom lash design assigns lashes of varying lengths to fill each frame of the plurality of frames.

22. The system of claim 21, wherein each frame of the plurality of frames is defined by a corresponding inner framing lash and a corresponding outer framing lash, and wherein a longest lash within each frame is limited by a length of the corresponding inner framing lash.

23. The system of claim 16, wherein the eye profile is selected from one of a straight profile, a downward profile, and an upward profile.

24. The system of claim 16, wherein the custom lash design includes a custom code for use in the physical application of the set of lashes, and wherein the custom code identifies at least one of a selected level of fullness, a selected level of curl, a selected type of lash, a selected lash length, a selected lash thickness, or a selected application method for the set of lashes.

25. The system of claim 16, wherein the custom lash design includes the lash framework, which defines framing lashes, and filler lashes positioned between the framing lashes.

26. The system of claim 16, wherein the eye profile is a straight profile when a position of an outside corner of the eye is at a same level as an inside corner of the eye, is a downward profile when the position of the outside corner is below the inside corner, and is an upward profile when the position of the outside corner is above the inside corner.

27. The system of claim 16, wherein the point of emphasis lies along a line that connects an outer edge of a corresponding nostril and an outer edge of an iris of the eye.

28. The system of claim 16, wherein the system is implemented on a mobile device.

\* \* \* \* \*